United States Patent [19]
Patel et al.

[11] Patent Number: 5,959,699
[45] Date of Patent: Sep. 28, 1999

[54] RECEPTION MODE CONTROL IN RADIO RECEIVERS FOR RECEIVING BOTH VSB AND QAM DIGITAL TELEVISION SIGNALS

[75] Inventors: Chandrakant B. Patel, Hopewell Township, N.J.; Allen LeRoy Limberg, Fairfax County, Va.

[73] Assignee: SamSung Electronics Co., Ltd., Suwon, Rep. of Korea

[21] Appl. No.: 09/082,530

[22] Filed: May 21, 1998

Related U.S. Application Data

[63] Continuation-in-part of application No. 08/773,949, Dec. 26, 1996, abandoned, which is a continuation-in-part of application No. 08/266,753, Jun. 28, 1994, and a continuation-in-part of application No. 08/614,471, Mar. 13, 1996, Pat. No. 5,715,012.

[51] Int. Cl.$^6$ ................................................ H04N 5/455
[52] U.S. Cl. .......................................... 348/726; 348/558
[58] Field of Search .................................. 348/725, 726, 348/558, 470, 21, 607, 611; 375/251, 350, 261, 345, 346

[56] References Cited

U.S. PATENT DOCUMENTS

| | | | |
|---|---|---|---|
| 5,506,636 | 4/1996 | Patel et al. | 348/725 |
| 5,565,932 | 10/1996 | Citta et al. | 348/726 |
| 5,636,250 | 6/1997 | Scarpa | 375/321 |
| 5,642,382 | 6/1997 | Juan | 375/232 |
| 5,715,012 | 2/1998 | Patel et al. | 348/555 |

*Primary Examiner*—Victor R. Kostak
*Attorney, Agent, or Firm*—Robert E. Bushnell, Esq.

[57] ABSTRACT

A radio receiver uses the same tuner for receiving a selected digital television (DTV) signal, irrespective of whether it is a quadrature-amplitude-modulation (QAM) or a vestigial sideband (VSB) signal. The tuner supplies a final IF signal in a 6-MHz-wide frequency band, the lowest frequency of which is not appreciably more than 2.69 MHz. The final IF signal is digitized at a rate that is a multiple of both the symbol frequencies of the QAM and VSB signals, for synchrodyning to baseband, with the 2.69 MHz difference between the carrier frequencies of QAM and VSB signals being taken into account in the digital synchrodyning circuitry. The carrier frequencies of the QAM and VSB final IF signals are regulated to be submultiples of the multiple of both the symbol frequencies of the QAM and VSB signals by applying automatic frequency and phase control signals developed in the digital circuitry to a local oscillator of the tuner.

29 Claims, 11 Drawing Sheets

RECEPTION MODE CONTROL IN RADIO RECEIVERS FOR RECEIVING BOTH VSB AND QAM DIGITAL TELEVISION SIGNALS

This is a continuation-in-part of U.S. patent application Ser. No. 08/773,949 filed Dec. 26, 1996, now abandoned which is a continuation-in-part of U.S. patent application Ser. No. 08/266,753 filed Jun. 28, 1994, and of U.S. patent application Ser. No. 08/614,471 filed Mar. 13, 1996, issued Feb. 3, 1998, as U.S. Pat. No. 5,715,012.

The invention relates to radio receivers having the capability of receiving digital television (DTV) signals such as digital high-definition television (HDTV) signals, transmitted using quadrature amplitude modulation (QAM) of the principal carrier wave or transmitted using vestigial sideband (VSB) amplitude modulation of the principal carrier wave.

BACKGROUND OF THE INVENTION

A Digital Television Standard published Sep. 16, 1995 by the Advanced Television Systems Committee (ATSC) specifies vestigial sideband (VSB) signals for transmitting digital television (DTV) signals in 6-MHz-bandwidth television channels such as those currently used in over-the-air broadcasting of National Television System Committee (NTSC) analog television signals within the United States. The VSB DTV signal is designed so its spectrum is likely to interleave with the spectrum of a co-channel interfering NTSC analog TV signal. This is done by positioning the pilot carrier and the principal amplitude-modulation sideband frequencies of the DTV signal at odd multiples of one-quarter the horizontal scan line rate of the NTSC analog TV signal that fall between the even multiples of one-quarter the horizontal scan line rate of the NTSC analog TV signal, at which even multiples most of the energy of the luminance and chrominance components of a co-channel interfering NTSC analog TV signal will fall. The video carrier of an NTSC analog TV signal is offset 1.25 MHz from the lower limit frequency of the television channel. The carrier of the DTV signal is offset from such video carrier by 59.75 times the horizontal scan line rate of the NTSC analog TV signal, to place the carrier of the DTV signal about 309,877.6 Hz from the lower limit frequency of the television channel. Accordingly, the carrier of the DTV signal is about 2,690122.4 Hz from the middle frequency of the television channel. The exact symbol rate in the Digital Television Standard is (684/286) times the 4.5 MHz sound carrier offset from video carrier in an NTSC analog TV signal. The number of symbols per horizontal scan line in an NTSC analog TV signal is 684, and 286 is the factor by which horizontal scan line rate in an NTSC analog TV signal is multiplied to obtain the 4.5 MHz sound carrier offset from video carrier in an NTSC analog TV signal. The symbol rate is $10.762238 * 10^6$ symbols per second, which can be contained in a VSB signal extending 5.381119 MHz from DTV signal carrier. That is, the VSB signal can be limited to a band extending 5.690997 MHz from the lower limit frequency of the television channel.

The ATSC standard for digital HDTV signal terrestrial broadcasting in the United States of America is capable of transmitting either of two high-definition television (HDTV) formats with 16:9 aspect ratio. One HDTV format uses 1920 samples per scan line and 1080 active horizontal scan lines per 30 Hz frame with 2:1 field interlace. The other HDTV format uses 1280 luminance samples per scan line and 720 progressively scanned scan lines of television image per 60 Hz frame. The ATSC standard also accommodates the transmission of DTV formats other than HDTV formats, such as the parallel transmission of four television signals having normal definition in comparison to an NTSC analog television signal.

DTV transmitted by vestigial-sideband (VSB) amplitude modulation (AM) for terrestrial broadcasting in the United States of America comprises a succession of consecutive-in-time data fields each containing 313 consecutive-in-time data segments. There are 832 symbols per data segment. So, with the symbol rate being 10.76 MHz, each data segment is of 77.3 microseconds duration. Each segment of data begins with a line synchronization code group of four symbols having successive values of +S, −S, −S and +S. The value +S is one level below the maximum positive data excursion, and the value −S is one level above the maximum negative data excursion. The initial line of each data field includes a field synchronization code group that codes a training signal for channel-equalization and multipath suppression procedures. The training signal is a 511-sample pseudo-random noise sequence (or "PN-sequence") followed by three 63-sample PN sequences. The middle one of these 63-sample PN sequences is transmitted in accordance with a first logic convention in the first line of each odd-numbered data field and in accordance with a second logic convention in the first line of each even-numbered data field, the first and second logic conventions being one's complementary respective to each other. The other two 63-sample PN sequences and the 511-sample PN sequence are transmitted in accordance with the same logic convention in all data fields.

The data within data lines are trellis coded using twelve interleaved trellis codes, each a ⅔ rate trellis code with one uncoded bit. The interleaved trellis codes are subjected to Reed-Solomon forward error-correction coding, which provides for correction of burst errors arising from noise sources such as a nearby unshielded automobile ignition system. The Reed-Solomon coding results are transmitted as 8-level (3 bits/symbol) one-dimensional-constellation symbol coding for over-the-air transmission, which transmissions are made without symbol precoding separate from the trellis coding procedure. The Reed-Solomon coding results are transmitted as 16-level (4 bits/symbol) one-dimensional-constellation symbol coding for cablecast, which transmissions are made without precoding. The VSB signals have their natural carrier wave, which would vary in amplitude depending on the percentage of modulation, suppressed.

The natural carrier wave is replaced by a pilot carrier wave of fixed amplitude, which amplitude corresponds to a prescribed percentage of modulation. This pilot carrier wave of fixed amplitude is generated by introducing a direct component shift into the modulating voltage applied to the balanced modulator generating the amplitude-modulation sidebands that are supplied to the filter supplying the VSB signal as its response. If the eight levels of 3-bit symbol coding have normalized values of −7, −5, −3, −1, +1, +3, +5 and +7 in the carrier modulating signal, the pilot carrier has a normalized value of 1.25. The normalized value of +S is +5, and the normalized value of −S is −5.

VSB signals using 8-level symbol coding will be used in over-the-air broadcasting within the United States, and VSB signals using 16-level symbol coding can be used in over-the-air narrowcasting systems or in cable-casting systems. However, certain cable-casting is likely to be done using suppressed-carrier quadrature amplitude modulation (QAM) signals instead, rather than using VSB signals. This presents television receiver designers with the challenge of designing receivers that are capable of receiving either type of transmission and of automatically selecting suitable receiving apparatus for the type of transmission currently being received.

It is assumed that the data format supplied for symbol encoding is the same in transmitters for the VSB DTV signals and in transmitters for the QAM DTV signals. The VSB DTV signals modulate the amplitude of only one phase of the carrier at symbol rate of $10.76 * 10^6$ symbols per second to provide a real signal unaccompanied by an imaginary signal, which real signal fits within a 6 MHz band because of its VSB nature with carrier near edge of band. Accordingly, the QAM DTV signals, which modulate two orthogonal phases of the carrier to provide a complex signal comprising a real signal and an imaginary signal as components thereof, are designed to have a symbol rate of $5.38 * 10^6$ symbols per second, which complex signal fits within a 6 MHz band because of its QAM nature with carrier at middle of band.

Processing after symbol decoding is similar in receivers for the VSB DTV signals and in receivers for the QAM DTV signals, assuming the data format supplied for symbol encoding is the same in transmitters for the VSB DTV signals and in transmitters for the QAM DTV signals. The data recovered by symbol decoding are supplied as input signal to a data de-interleaver, and the de-interleaved data are supplied to a Reed-Solomon decoder. Error-corrected data are supplied to a data de-randomizer which regenerates packets of data for a packet decoder. Selected packets are used to reproduce the audio portions of the DTV program, and other selected packets are used to reproduce the video portions of the DTV program.

The zero-intermediate-frequency (ZIF) receivers, which perform amplification and channel selection at baseband, that are used for receiving QAM DTV signals are not well suited for receiving VSB DTV signals. This is because of problems with securing adequate adjacent-channel rejection in a ZIF receiver when the carrier is not at the center frequency of the channel. The tuners can be quite similar in receivers for the VSB DTV signals and in receivers for the QAM DTV signals if the receivers are of superheterodyne types, however. The differences in the receivers reside in the synchrodyning procedures used to translate the final IF signal to baseband and in the symbol decoding procedures. A receiver that is capable of receiving either VSB or QAM DTV signals is more economical in design if it does not duplicate the similar tuner circuitry prior to synchrodyning to baseband and the similar receiver elements used after the symbol decoding circuitry. The challenge is in optimally constructing the circuitry for synchrodyning to baseband and for symbol decoding to accommodate both DTV transmission standards and in arranging for the automatic selection of the appropriate mode of reception for the DTV transmission currently being received.

DTV signal radio receivers are known of a type that uses double-conversion in the tuner followed by synchronous detection, having been used during field testing of the HDTV system used during development the ATSC standard. A frequency synthesizer generates first local oscillations that are heterodyned with the received VSB DTV signals to generate first intermediate frequencies (e. g., with 920 MHz center frequency and 922.69 MHz carrier). A passive LC bandpass filter selects these first intermediate frequencies from their image frequencies for amplification by a first intermediate-frequency amplifier, and the amplified first intermediate frequencies are filtered by a ceramic resonator filter that rejects adjacent channel signals. The first intermediate frequencies are heterodyned with second local oscillations to generate second intermediate frequencies (e. g., with 46.69 MHz carrier); and a filter, which can be of surface-acoustic-wave (SAW) type, selects these second intermediate frequencies from their images and from remnant adjacent channel responses for amplification by a second intermediate-frequency amplifier. The response of the second intermediate-frequency amplifier is supplied to a third mixer to be synchrodyned to baseband with third local oscillations of fixed frequency. The third local oscillations of fixed frequency can be supplied in 0° phasing and in 90° phasing, thereby implementing separate in-phase and quadrature-phase synchronous detection procedures during synchrodyning. Synchrodyning is the procedure of multiplicatively mixing a modulated signal with a wave having a fundamental frequency the same as the carrier of the modulated signal, being locked in frequency and phase thereto, and lowpass filtering the result of the multiplicative mixing to recover the modulating signal at baseband, baseband extending from zero frequency to the highest frequency in the modulating signal.

Separately digitizing in-phase and quadrature-phase synchronous detection results generated in the analog regime presents problems with regard to the synchronous detection results satisfactorily tracking each other after digitizing; quantization noise introduces pronounced phase errors in the complex signal considered as a phasor. These problems can be avoided in DTV signal radio receivers of types performing the in-phase and quadrature-phase synchronous detection procedures in the digital regime. By way of example, the response of the second intermediate-frequency amplifier is digitized at twice the Nyquist rate of the symbol coding. The successive samples are considered to be consecutively numbered in order of their occurrence; and odd samples and even samples are separated from each other to generate respective ones of the in-phase (or real) and quadrature-phase (or imaginary) synchronous detection results. Quadrature-phase (or imaginary) synchronous detection takes place after Hilbert transformation of one set of samples using appropriate finite-impulse-response (FIR) digital filtering, and in-phase (or real) synchronous detection of the other set of samples is done after delaying them for a time equal to the latency time of the Hilbert-transformation filter. The methods of locking the frequency and phase of synchronous detection and the methods of locking the frequency and phase of symbol decoding have differed in the VSB and QAM DTV receivers.

These types of known DTV signal radio receiver present some problem in the design of the tuner portion of the receiver because the respective carrier frequencies of VSB DTV signals and of QAM DTV signals are not the same as each other. The carrier frequency of a QAM DTV signal is at the middle of a 6MHz-wide TV channel, but the carrier frequency of a VSB DTV signal nominally is about 310 kHz above the lower limit frequency of the TV channel. Accordingly, the third local oscillations of fixed frequency, which are used for synchrodyning to baseband, must be of different frequency when synchrodyning VSB DTV signals to baseband than when synchrodyning QAM DTV signals to baseband. The 2.69 MHz difference between the two carrier frequencies is larger than that which is readily accommodated by applying automatic frequency and phase control to the third local oscillator. A third oscillator that can switchably select between two frequency-stabilizing crystals is a practical necessity. In such an arrangement, of course, alterations in the tuner circuitry are involved with arranging for the automatic selection of the appropriate mode of reception for the DTV transmission currently being received. The radio-frequency switching that must be done reduces the reliability of the tuner. The RF switching and the additional frequency-stabilizing crystal for the third oscillator increase the cost of the tuner appreciably.

Radio receivers for receiving digital television signals, in which receiver the final intermediate-frequency signal is somewhere in the 1–8 MHz frequency range rather than at baseband, are described by C. B. Patel et alii in U.S. Pat. No. 5,479,449 issued Dec. 26, 1995, entitled DIGITAL VSB DETECTOR WITH BANDPASS PHASE TRACKER, AS FOR INCLUSION IN AN HDTV RECEIVER, and included herein by reference. The use of infinite-impulse response filters for developing complex digital carriers in such receivers is described by C. B. Patel et alii in U.S. Pat. No. 5,548,617 issued Aug. 20, 1996, entitled DIGITAL VSB DETECTOR WITH BANDPASS PHASE TRACKER USING RADER FILTERS, AS FOR USE IN AN HDTV RECEIVER, and incorporated herein by reference. The use of finite-impulse response filters for developing complex digital carriers in such receivers is described by C. B. Patel et alii in U.S. Pat. No. 5,731,848 issued Mar. 24, 1998, entitled DIGITAL VSB DETECTOR WITH BANDPASS PHASE TRACKER USING NG FILTERS, AS FOR USE IN AN HDTV RECEIVER, and incorporated herein by reference. The design of receivers for both QAM and VSB signals in which QAM/VSB receivers both types of signal are processed through the same intermediate-frequency amplifiers receivers is described by C. B. Patel et alii in U.S. Pat. No. 5,506,636 issued Apr. 9, 1996, entitled HDTV SIGNAL RECEIVER WITH IMAGINARY-SAMPLE-PRESENCE DETECTOR FOR QAM/VSB MODE SELECTION, and incorporated herein by reference. U.S. Pat. No. 5,606,579 issued Feb. 25, 1997 to C. B. Patel et alii and entitled DIGITAL VSB DETECTOR WITH FINAL I-F CARRIER AT SUBMULTIPLE OF SYMBOL RATE, AS FOR HDTV RECEIVER is incorporated herein by reference. U.S. Pat. No. 5,659,372 issued Aug. 19, 1997 by C. B. Patel et alii and entitled DIGITAL TV DETECTOR RESPONDING TO FINAL-IF SIGNAL WITH VESTIGIAL SIDEBAND BELOW FULL SIDEBAND IN FREQUENCY is incorporated herein by reference. Allowed U.S. patent application Ser. No. 08/266,753 filed Jun. 28, 1994 by C. B. Patel et alii and entitled RADIO RECEIVER FOR RECEIVING BOTH VSB AND QAM DIGITAL HDTV SIGNALS is incorporated herein by reference. U.S. Pat. No. 5,715,012 issued Feb. 3, 1998 to C. B. Patel et alii and entitled RADIO RECEIVERS FOR RECEIVING BOTH VSB AND QAM DIGITAL HDTV SIGNALS is incorporated herein by reference. These patents and patent applications are all assigned to Samsung Electronics Co., Ltd., pursuant to employee invention agreements already in force at the time the inventions disclosed in these patents and patent applications were made.

In the QAM/VSB radio receivers described in U.S. Pat. Nos. 5,506,636 and 5,715,012 the final intermediate-frequency signal is digitized, and synchrodyne procedures to obtain baseband samples are carried out in the digital regime. A tuner within the receiver includes elements for selecting one of channels at different locations in a frequency band used for transmitting DTV signals, a succession of mixers for performing a plural conversion of signal received in the selected channel to a final intermediate-frequency (IF) signal, a respective frequency-selective amplifier between each earlier one of the mixers in that succession and each next one of said mixers in that succession, and a respective local oscillator for supplying oscillations to each of the mixers. Each of these local oscillators supplies respective oscillations of substantially the same frequency irrespective of whether the selected DTV signal is a QAM signal or is a VSB signal. The final IF signal is digitized, and thereafter there are differences in signal processing depending on whether the selected DTV signal is a QAM signal or is a VSB signal. These differences are accommodated in digital circuitry including QAM synchrodyning circuitry and VSB synchrodyning circuitry. The QAM synchrodyning circuitry generates real and imaginary sample streams of interleaved QAM symbol code, by synchrodyning the digitized final IF signal to baseband providing it is a QAM signal and otherwise processing the digitized final IF signal as if it were a QAM signal to be synchrodyned to baseband. The VSB synchrodyning circuitry generates a real sample stream of interleaved VSB symbol code, by synchrodyning the digitized final IF signal to baseband providing it is a VSB signal and otherwise processing the digitized final IF signal as if it were a VSB signal to be synchrodyned to baseband. Detection circuitry for sensing the presence of a pilot carrier accompanying a DTV signal of VSB type determines whether or not the final IF signal is a VSB signal to generate a control signal, which is in a first condition when the final IF signal apparently is not a VSB signal and is in a second condition when the final IF signal apparently is a VSB signal. Responsive to the control signal being in its first condition, the radio receiver is automatically switched to operate in a QAM signal reception mode; and responsive to the control signal being in its second condition, the radio receiver is automatically switched to operate in a VSB signal reception mode.

U.S. patent application Ser. No. 08/266,753 and U.S. Pat. Nos. 5,506,636 and 5,715,012 were written presuming that the carrier frequency of a VSB DTV signal would be 625 kHz above lowest channel frequency, as earlier proposed by a subcommittee of the Advanced Television Systems Committee. This specification presumes that the carrier frequency of a VSB DTV signal is about 310 kHz above lowest channel frequency, as specified in Annex A of the Digital Television Standard published Sep. 16, 1995. In accordance with convention this specification presumes that the Nth harmonic of a frequency is N times that frequency, N being an integer, and that the Nth subharmonic of a frequency is that frequency divided by the factor (N+1).

SUMMARY OF THE INVENTION

The invention is embodied in a radio receiver for receiving a selected one of DTV signals each including symbol codes descriptive of digital signals, irrespective of whether the selected DTV signal is a quadrature-amplitude-modulation (QAM) signal or is a vestigial sideband (VSB) signal including a pilot carrier having a frequency 310 kHz above the lowest frequency in the television channel. A tuner within the receiver includes elements for selecting one of channels at different locations in a frequency band used for transmitting DTV signals, a succession of mixers for performing a plural conversion of signal received in the selected channel to a final intermediate-frequency (IF) signal, a respective frequency-selective amplifier between each earlier one of the mixers in that succession and each next one of said mixers in that succession, and a respective local oscillator for supplying oscillations to each of the mixers. Each of these local oscillators supplies respective oscillations of substantially the same frequency irrespective of whether the selected DTV signal is a QAM signal or is a VSB signal. The final IF signal is digitized, and thereafter there are differences in signal processing depending on whether the selected DTV signal is a QAM signal or is a VSB signal are accommodated principally in digital circuitry including QAM synchrodyning circuitry and VSB synchrodyning circuitry. The QAM synchrodyning circuitry generates real and imaginary sample streams of QAM symbol code, by synchrodyning the digitized final IF signal to baseband providing it is a QAM signal and otherwise processing the digitized final IF signal as if it were a QAM signal to be synchrodyned to baseband. The VSB synchrodyning circuitry generates a real sample stream of VSB symbol code, by synchrodyning the digitized final IF signal to baseband providing it is a VSB signal and otherwise processing the digitized final IF signal as if it were a VSB signal to be synchrodyned to baseband. A detector determines by sensing the presence of a pilot carrier accompanying a DTV signal of VSB type whether the final IF signal is a QAM signal or a VSB signal to generate a control signal, which is in a first condition when the final IF signal is a QAM signal and is in a second condition when the final IF signal is a VSB signal. Responsive to the control signal being in its first condition, the radio receiver is automatically switched to operate in a QAM signal reception mode; and responsive to the control signal being in its second condition, the radio receiver is automatically switched to operate in a VSB signal reception mode.

In the block schematic diagrams, clock or control signal connections are shown in dashed line, where it is desired to distinguish them from connections for the signals being controlled. To avoid overcomplexity in the block schematic diagrams, some shimming delays necessary in the digital circuitry are omitted, where a need for such shimming delay is normally taken into account by a circuit or system designer.

DETAILED DESCRIPTION

Figure 1:
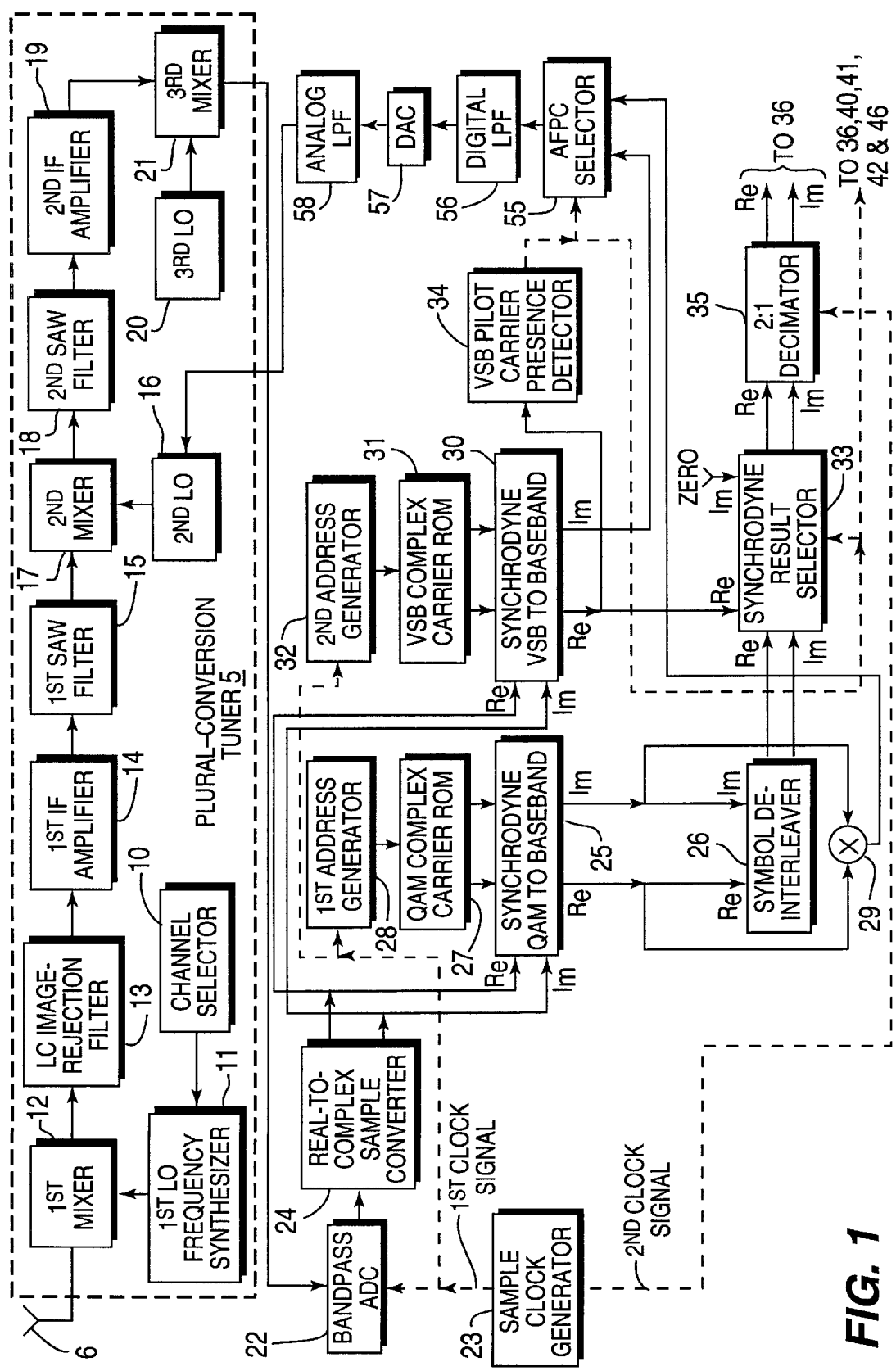
FIG. 1 is a block schematic diagram of initial portions of a digital HDTV signal radio receiver of a type embodying the invention, including circuitry for detecting symbols in an HDTV signal of QAM type and circuitry for detecting symbols in an HDTV signal of VSB type.

FIG. 1 shows a tuner 5 comprising elements 11–21 that selects one of channels at different locations in the frequency band for DTV signals and performs plural frequency conversion of the selected channel to a final intermediate-frequency signal in a final intermediate-frequency band. FIG. 1 shows a broadcast receiving antenna 6 arranged to capture the DTV signals for the tuner 5. Alternatively, the tuner 5 can be connected for receiving DTV signals from a narrowcast receiving antenna or from a cablecast transmission system.

More particularly, in the tuner 5 shown in FIG. 1, a channel selector 10 designed for operation by a human being determines the frequency of first local oscillations that a frequency synthesizer 11, which functions as a first local oscillator, furnishes to a first mixer 12 for heterodyning with DTV signals received from the antenna 6 or an alternative source of such signals. The first mixer 12 upconverts the received signals in the selected channel to prescribed first intermediate frequencies (e. g., with 922.69 MHz carrier), and an LC filter 13 is used to reject the unwanted image frequencies that accompany the upconversion result supplied from the first mixer 12. The first intermediate-frequency signal resulting from the upconversion, supplied as the filter 13 response, is applied as the input signal to a first intermediate-frequency amplifier 14, which supplies amplified first IF signal for driving a first surface-acoustic-wave (SAW) filter 15 or a filter constructed from ceramic resonators. The upconversion to the rather high-frequency first intermediate frequencies facilitates the SAW filter 15 having a large number of poles and zeroes. The SAW filter 15 passband is designed to pass those frequencies obtained by converting frequencies extending from the lower limit frequency of the television channel up to about 300 kHz of the upper limit frequency of the television channel. Preferably the SAW filter 15 is designed to reject the frequency-modulated sound carrier of any co-channel interfering NTSC analog TV signal. Second local oscillations from a second local oscillator 16 are supplied to a second mixer 17 for heterodyning with the response of the first SAW filter 15, to generate second intermediate frequencies (e. g., with 46.69 MHz carrier). A second SAW filter 18 is used for rejecting the unwanted image frequencies that accompany the downconversion result supplied from the second mixer 17. During the period of transition from NTSC television transmissions to digital television transmissions, the second SAW filter 18 will usually include traps for sound and video carriers of adjacent-channel NTSC television transmissions. The second IF signal supplied as the response of the second SAW filter 18 is applied as input signal to a second intermediate-frequency amplifier 19, which generates an amplified second IF signal response to its input signal. Oscillations from a third local oscillator 20 are heterodyned with the amplified second IF signal response in a third mixer 21. The plural-conversion tuner 5 as thusfar described resembles those previously proposed by others, except that the frequency of the oscillations from the third local oscillator 20 is chosen such that the third mixer 21 supplies a third intermediate-frequency signal response.

This third IF signal response is the final intermediate-frequency output signal of the tuner 5, which is supplied to a subsequent analog-to-digital converter (ADC) 22 for digitization. This final IF signal occupies a frequency band 6 MHz wide, the lowest frequency of which is above zero frequency. The lowpass analog filtering of the third mixer 21 response done in the ADC 22 as a preliminary step in analog-to-digital conversion suppresses the image frequencies of the third intermediate frequencies, and the second SAW filter 18 has already restricted the bandwidth of the third intermediate-frequency signals presented to the ADC 22 to be digitized; so the ADC 22 functions as a bandpass analog-to-digital converter. The sampling of the lowpass analog filter response in the ADC 22 as the next step in analog-to-digital conversion is done responsive to pulses in a first clock signal supplied from a sample clock generator 23.

The sample clock generator 23 preferably includes a crystal oscillator capable of frequency control over a relatively narrow range for generating cissoidal oscillations at a multiple of symbol rate. A symmetrical clipper or limiter generates a square-wave response to these cissoidal oscillations to generate the first clock signal, which the ADC 22 uses to time the sampling of the final IF signal after filtering to limit bandwidth. The frequency of the cissoidal oscillations generated by the crystal oscillator in the sample clock generator 23 can be determined by an automatic frequency and phase control (AFPC) signal developed in response to components of the received DTV signal that are subharmonics of symbol or baud rate, for example, as will be described in detail further on in this specification. The pulses in the first clock signal recur at a $21.52 * 10^6$ samples-per-second rate, twice the $10.76 * 10^6$ symbols-per-second symbol rate for VSB signals and four times the $5.38 * 10^6$ symbols-per-second symbol rate for QAM signals. At this $21.52 * 10^6$ samples-per-second clock rate, placing the final IF signal so its mid-frequency is above 5.38 MHz reduces the number of $21.52 * 10^6$ samples-per-second rate samples in the QAM carrier to less than four, which undesirably reduces the uniformity of synchrodyne response supplied for symbol decoding.

The ADC 22 supplies real digital responses of 10-bit or so resolution to the samples of the band-limited final IF signal, which digital responses are converted to complex digital samples by the circuitry 24. Various ways to construct the circuitry 24 are known. The imaginary digital samples at the QAM carrier frequency may be generated using a Hilbert transformation filter, for example, as described in U.S. Pat. No. 5,479,449. If the frequency band 6 MHz wide occupied by the final IF signal has a lowest frequency of at least a megaHertz or so, it is possible to keep the number of taps in the Hilbert transformation filter reasonably small and thus keep the latency time of the filter reasonably short. Other ways to construct the circuitry 24 described in U.S. Pat. No. 5,548,617 rely on the differential delay between the responses of two infinite-impulse-response (IIR) filters being substantially equal to 90° phase shift at all frequencies. Still other ways to construct the circuitry 24 rely on the differential delay between the responses of two finite-impulse-response (FIR) filters being substantially equal to 90° phase shift at all frequencies.

In the FIG. 1 receiver circuitry the complex digital samples of final IF signal supplied from the circuitry 24 are applied to circuitry 25 for synchrodyning the QAM signal to baseband. The circuitry 25 supplies a stream of real samples and a stream of imaginary samples in parallel to a symbol de-interleaver 26, to provide baseband description of the QAM modulating signal. The QAM synchrodyning circuitry 25 receives complex-number digital descriptions of two phasings of the QAM carrier, as translated to final intermediate frequency and in quadrature relationship with each other, from read-only memory 27. ROM 27, which comprises sine and cosine look-up tables for QAM carrier frequency, is addressed by a first address generator 28. The first address generator 28 includes an address counter (not explicitly shown in FIG. 1) for counting the recurrent clock pulses in the first clock signal generated by the sample clock generator 23. The resulting address count is augmented by a symbol phase correction term generated by QAM de-rotator correction circuitry, thereby to generate the addressing for the ROM 27. The QAM synchrodyne circuitry 25, the first address generator 28, and the operation of each will be explained in greater detail further on in this specification.

In the FIG. 1 receiver circuitry the complex digital samples of final IF signal supplied from the circuitry 24 are also applied to circuitry 30 for synchrodyning the VSB signal to baseband. The VSB synchrodyning circuitry 30 supplies streams of samples descriptive of real and imaginary components of the vestigial-sideband modulating signal as synchrodyned to baseband. The VSB synchrodyning circuitry 30 receives complex-number digital descriptions of two phasings of the VSB carrier, as translated to final intermediate frequency and in quadrature relationship with each other, from read-only memory 31. ROM 31, which comprises sine and cosine look-up tables for VSB carrier frequency, is addressed by a second address generator 32. The second address generator 32 includes an address counter (not explicitly shown in FIG. 1) for counting the recurrent clock pulses in the first clock signal generated by the sample clock generator 23. In preferred embodiments of the invention this address counter is the same address counter used by the first address generator 28. The resulting address count is augmented by a symbol phase correction term generated by symbol phase correction circuitry, thereby to generate the addressing for the ROM 31. The VSB synchrodyne circuitry 30, the second address generator 32, and the operation of each will be explained in greater detail further on in this specification.

A digital-signal multiplexer 33 functions as a synchrodyne result selector that selects as its response either a first or a second one of two complex digital input signals supplied thereto, the selection being controlled by a detector 34 for detecting average energy in the zero-frequency term of the real samples from the VSB synchrodyne circuitry 30. While the QAM signal has components at the VSB signal carrier frequency that can be detected to affect the real samples supplied from the VSB synchrodyne circuitry 30 during QAM signal reception, the phase of those components is random with QAM signal and tends to average over time to a lower energy level than the response to the pilot carrier during VSB signal reception, the phase of the pilot carrier being invariant over time. When the digital DTV receiver has its power initially turned on or when a television channel is first tuned to, the detector 34 initially conditions the DTV receiver for VSB reception for a time sufficient for VSB synchrodyne circuitry 30 to synchronously detect whether a pilot carrier is received accompanying a VSB signal transmission. Thereafter, when the zero-frequency term has essentially zero average energy, indicating the absence of pilot carrier signal that accompanies a VSB signal, the multiplexer 33 selectively responds to its first complex digital input signal, which is the de-interleaved QAM synchrodyne-to-baseband result supplied from the de-interleaver 26. When the zero-frequency term has substantial average energy, indicating the presence of pilot carrier signal that accompanies a VSB signal, the multiplexer 33 selectively responds to its second complex digital input signal comprising the real and imaginary components of the baseband response of the VSB synchrodyne circuitry 30.

The response of the synchrodyne result selection multiplexer 33 is resampled in response to a second clock signal from the sample clock generator 23 in 2:1 decimation circuitry 35, to reduce the sample rate of complex baseband response down to the 10.76 MHz VSB symbol rate, which is twice the 5.38 MHz QAM symbol rate. That is, the stream of real digital samples and the stream of imaginary digital samples are both decimated 2:1. The 2:1 decimation of the multiplexer 33 response prior to its application as input signal to an amplitude-and-group-delay equalizer 36 reduces the hardware requirements on the equalizer. Alternatively, rather than 2:1 decimation circuitry 35 being used after the synchrodyne result selection multiplexer 33, the baseband responses of the QAM synchrodyne circuitry 25 and of the VSB synchrodyne circuitry 30 can each be resampled in response to a second clock signal from the sample clock generator 23 to carry out 2:1 decimation before the synchrodyne result selection multiplexer 33.

Figure 2:
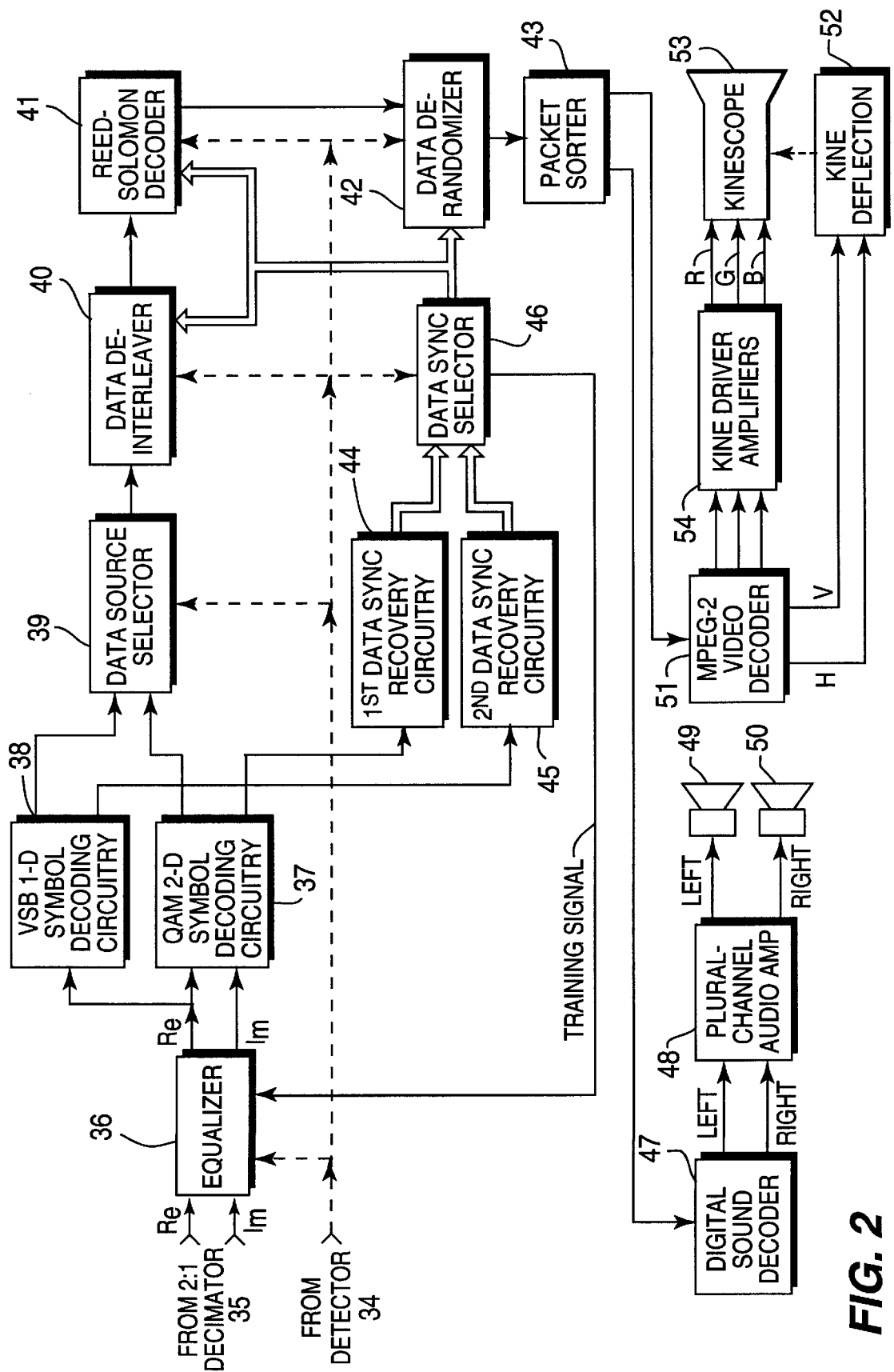
FIG. 2 is a block schematic diagram of remaining portions of the digital HDTV signal radio receiver of a type embodying the invention, including an amplitude equalizer for symbols selected from the circuitry for detecting symbols in an HDTV signal of QAM type and the circuitry for detecting symbols in an HDTV signal of VSB type.

FIG. 2 shows the amplitude-and-group-delay equalizer 36, which converts a baseband response with an amplitude-and-phase-versus-frequency characteristic that tends to cause inter-symbol error to an improved amplitude-versus-frequency characteristic that minimizes the likelihood of inter-symbol error. The amplitude-and-group-delay equalizer 36 can be a suitable one of the monolithic ICs available off-the-shelf for use in equalizers. Such an IC includes a multiple-tap digital filter used for amplitude-and-group-delay equalization, the tap weights of which filter are programmable; circuitry for selectively accumulating a training signal and temporarily storing the accumulation results; and a microcomputer for calculating updated tap weights of the multiple-tap digital filter used for amplitude-and-group-delay equalization.

When the DTV signal being received is of VSB type, training signal is contained in the initial data segment of each data field. The microcomputer is programmed for comparing the temporarily stored accumulation results with the ideal training signal as known a priori and establishing a set of weighting coefficients for the multiple-tap digital filter used for amplitude-and-group-delay equalization. Thereafter, better to compensate for changing multipath conditions such as caused by overflying aircraft, weighting coefficients may be updated on a more frequent basis using decision-directed equalization techniques, such as those disclosed by the inventors and Dr. Jian Yang in U.S. Pat. No. 5,648,987 issued Jul. 15, 1997 and entitled RAPID-UPDATE ADAPTIVE CHANNEL-EQUALIZATION FILTERING FOR DIGITAL RADIO RECEIVERS, SUCH AS HDTV RECEIVERS. When the DTV signal being received is of QAM type, unless provision is made for inclusion of a training signal, decision-directed equalization techniques have to be used if equalization is to be effected. The establishment of a satisfactory set of initial weighting coefficients takes more time than when a training signal is available. If the DTV receiver remains in place during periods of operation and non-operation, the time required to establish a satisfactory set of initial weighting coefficients when a DTV channel is retuned can be reduced by if the last determined set of weighting coefficients for that DTV channel have been stored in memory.

Both the real and the imaginary responses of the amplitude-and-group-delay equalizer 36 are applied as input signal to two-dimensional symbol decoding circuitry 37, which performs the symbol decoding that recovers symbol-decoded digital data streams from a QAM-origin signal. Presuming that the QAM-origin signal contains data synchronizing information corresponding to the data synchronizing information in the VSB-origin signal, one of these symbol-decoded digital data streams is a trellis-decoded digital data stream supplied for further data processing, and another of these symbol-decoded digital data streams is generated by data-slicing without subsequent trellis decoding. Data synchronizing information is extracted from this latter symbol-decoded digital data stream and is employed for controlling the processing of the QAM-origin data by the receiver.

The real response of the amplitude-and-group-delay equalizer 36 is applied as input signal to one-dimensional symbol decoding circuitry 38, which performs the symbol decoding that recovers symbol-decoded digital data streams from a VSB-origin signal. A VSB signal in accordance with the ATSC standard uses trellis coding of the data in all data segments except the initial data segment of each data field, which contains field synchronization code groups that are not subject to trellis coding. As in the prior art, one of the symbol-decoded digital data streams that the symbol decoding circuitry 38 supplies, which is to be employed for further data processing is generated by trellis-decoding the results of data-slicing procedures, and optimal Viterbi decoding techniques are customarily employed. As in the prior art, another of the symbol-decoded digital data streams that the symbol decoding circuitry 38 supplies, which is to be employed for controlling data handling by the receiver responsive to synchronization information contained in the received VSB-origin signal, is generated using data-slicing procedures without subsequent trellis decoding. The symbol decoding circuitry 38 preferably departs from usual prior-art practice by utilizing data-slicing techniques similar to those described in U.S. Pat. No. 5,748,226 issued May 5, 1998, entitled DIGITAL TELEVISION RECEIVER WITH ADAPTIVE FILTER CIRCUITRY FOR SUPPRESSING NTSC CO-CHANNEL INTERFERENCE, and incorporated herein by reference.

A digital-signal multiplexer 39 functions as a data source selector that selects as its response either a first or a second one of two digital input signals thereto, the selection being controlled by the detector 34 for detecting the zero-frequency term of the real samples from the VSB synchrodyne circuitry 30. When the zero-frequency term has essentially zero average energy, indicating the absence of pilot carrier signal that accompanies a VSB signal, the multiplexer 39 selectively responds to its first digital input signal, selecting as the source of its digital data output the two-dimensional symbol decoding circuitry 37 that decodes the symbols received in the QAM signal. When the zero-frequency term has substantial average energy, indicating the presence of pilot carrier signal that accompanies a VSB signal, the multiplexer 39 selectively responds to its second digital input signal, selecting as the source of its digital data output the one-dimensional symbol decoding circuitry 38 that decodes the symbols received in the VSB signal.

The data selected by the data source selection multiplexer 39 are applied to a data de-interleaver 40 as its input signal, and the de-interleaved data supplied from the data de-interleaver 40 are applied to a Reed-Solomon decoder 41. The data de-interleaver 40 is often constructed within its own monolithic IC and is made so as to respond to the output indications from the pilot carrier presence detector 34 to select the de-interleaving algorithm suitable to the DTV signal currently being received, whether it be of QAM or VSB type; this is a mere matter of design. The Reed-Solomon decoder 41 is often constructed within its own monolithic IC and is made so as to respond to the output indications from the pilot carrier presence detector 34 to select the appropriate Reed-Solomon decoding algorithm for the DTV signal currently being received, whether it be of QAM or VSB type; this also is a mere matter of design. Error-corrected data are supplied from the Reed-Solomon decoder 41 to a data de-randomizer 42, which responds to these data for regenerating a signal randomized prior to transmission to the DTV receiver, which regenerated signal comprises packets of data for a packet sorter 43. The data de-randomizer 42 is made so as to respond to the output indications from the pilot carrier presence detector 34 to select the appropriate data de-randomizing algorithm for the DTV signal currently being received, whether it be of QAM or VSB type; the selection of these algorithms is a mere matter of design, too.

First data synchronization recovery circuitry 44 recovers the data synchronizing information included in the data output of the two-dimensional symbol decoding circuitry decoder 37, and second data synchronization recovery circuitry 45 recovers the data synchronizing information included in the data output of the one-dimensional symbol decoding circuitry 38. A data sync selector 46 selects between the data synchronizing information as provided by the data sync recovery circuitry 44 and as provided by the data sync recovery circuitry 45, the selection being controlled by the detector 34 for detecting the zero-frequency term of the real samples from the VSB synchrodyne circuitry 30. When the zero-frequency term has essentially zero average energy, indicating the absence of pilot carrier signal that accompanies a VSB signal, the data sync selector 46 selects for its output signals the data synchronizing information provided by the data sync recovery circuitry 44. When the zero-frequency term has substantial average energy, indicating the presence of pilot carrier signal that accompanies a VSB signal, the data sync selector 46 selects for its output signals the data synchronizing information provided by the data sync recovery circuitry 45.

When the data sync selector 46 selects for its output signals the data synchronizing information provided by the data sync recovery circuitry 45, the initial data lines of each data field are selected for application to the amplitude-and-group-delay equalizer 36 as training signal. The occurrences of the 511-sample PN sequence can be detected within the data sync recovery circuitry 45 to provide data-field indexing information to the data sync selector 46. Alternatively, the occurrences of two or three consecutive 63-sample PN sequences are detected within the data sync recovery circuitry 45 to provide data-field indexing information to the data sync selector 46.

The standards for a QAM DTV signal are not as well defined at this time as the standards for a VSB DTV signal. A 32-state QAM signal provides sufficient capacity for a single HDTV signal, without having to resort to compression techniques outside MPEG standards, but commonly some compression techniques outside MPEG standards are employed to encode the single HDTV signal as a 16-state QAM signal. Typically, the occurrence of a prescribed 24-bit word is detected by the data sync recovery circuitry 44 to generate data-field indexing information for application to the data sync selector 46. A multiplexer within the data sync selector 46 selects between the data-field indexing information respectively supplied by the data sync recovery circuitry 44 and the data sync recovery circuitry 45; the data-field indexing information thus selected is supplied to the data de-interleaver 40, the Reed-Solomon decoder 41, and the data de-randomizer 42. At the time this specification is written there is no training signal included in the QAM DTV signal. Accordingly, in response to the VSB pilot carrier presence detector 34 indicating the absence of pilot carrier, the amplitude-and-group-delay equalizer 36 is conditioned to use decision-directed equalization techniques that do not depend on a training signal; and the VSB training signal selected by the data sync recovery circuitry 45 is wired through the data sync selector 46 without need for a multiplexer. Also, there is no data line synchronization signal for QAM DTV transmission, at least not a data line synchronization signal selected as a standard. The data sync recovery circuitry 44 includes counting circuitry for counting the samples in each data field to generate intra-data-field synchronizing information. This intra-data-field synchronizing information and the intra-data-field synchronizing information (such as data line count) generated by the data sync recovery circuitry 45 are selected between by appropriate multiplexers in the data sync selector 46, for application to the data de-interleaver 40, the Reed-Solomon decoder 41, and the data de-randomizer 42, as required.

FIG. 2 of the U.S. Pat. No. 5,506,636 drawing shows a variant of the symbol decoding circuitry 37 in which variant the trellis decoding results and the symbol-decoded data synchronization are time-division-multiplexed onto a single bus for application to the data source selector 39 and to the first data sync recovery circuitry 44. FIG. 2 of the U.S. Pat. No. 5,506,636 drawing also shows a variant of the symbol decoding circuitry 38 in which variant the trellis decoding results and the symbol-decoded data synchronization are time-division-multiplexed onto a single bus for application to the data source selector 39 and to the second data sync recovery circuitry 45. As in the embodiment shown in FIG. 2 of the drawing for this specification, the first data sync recovery circuitry 44 and the second data sync recovery circuitry 45 perform data synchronization by match filtering of symbol decoding results. If the initial data segment of each data field per the ATSC specification for VSB broadcasting is simply recoded using the symbol codes for QAM cablecasting, data synchronization can be performed after symbol decoding the QAM signal by looking for symbol-decoded PN sequence information. Data synchronization is shown in FIG. 2 as being performed after symbol decoding the VSB signal; this is done by looking for symbol-decoded PN sequence information. If the initial data segment of each data field per the ATSC specification for VSB broadcasting is simply recoded using the symbol codes for QAM cablecasting, then, in a modification of the FIG. 2 DTV receiver circuitry, data synchronization can be performed after symbol decoding using the same apparatus during both VSB signal reception and during QAM signal reception.

Data synchronization during VSB signal reception can alternatively be accomplished before symbol decoding, using match filters that generate spike responses to the PN sequences in the decimator 35 response or in the equalizer 36 response. The filters that generate spike responses to synchronization code sequences are preferably supplied input signals at the decimated sample rate, rather than input signals being the undecimated responses of synchrodyne circuits 29 and 30, in order to reduce the number of samples in the respective kernel of each match filter. The filters that generate spike responses to synchronization code sequences are preferably connected to receive the equalizer 36 response to reduce the effect that multi-path reception has on data synchronization.

The packet sorter 43 sorts packets of data for different applications, responsive to header codes in the successive packets of data. Packets of data descriptive of the audio portions of the DTV program are applied by the packet sorter 43 to a digital sound decoder 47. The digital sound decoder 47 supplies left-channel and right-channel stereophonic sound signals to a plural-channel audio amplifier 48 that drives the plurality of loudspeakers 49, 50. Packets of data descriptive of the video portions of the DTV program are applied by the packet sorter 43 to an MPEG decoder 51, such as of MPEG-2 type. The MPEG decoder 51 supplies horizontal (H) and vertical (V) synchronizing signals to kinescope deflection circuitry 52 that provides for the raster scanning of the viewing screen of a kinescope 53. The MPEG decoder 51 also supplies signals to the kinescope driver amplifiers 54 for applying amplified red (R), green (G) and blue (B) drive signals to the kinescope 53. In variations of the DTV receiver shown in FIGS. 1 and 2, a different display device may be used instead of or in addition to the kinescope 53, and the sound recovery system may be different, consisting of but a single audio channel, or being more elaborate than a simple stereophonic reproduction system.

Referring back to FIG. 1, in order that ROMs 27 and 31 can be used to generate digital complex-number descriptions of the QAM and VSB signal carriers as translated to respective final intermediate frequencies, in response to addressing generated by counting first clock signals, provision must be made to lock the one those final intermediate frequencies that is the carrier of the currently received DTV signal to a submultiple of a multiple of the first clock signal frequency. That is, those final intermediate frequencies must be in whole number ratios with the first clock signal frequency. An automatic phase and frequency control (AFPC) signal is developed in the digital circuitry following the analog-to-digital converter 22 and is used to control the frequency and phase of one of the local oscillators 11, 16 and 20 in the tuner. Using a fixed-frequency third local oscillator 20, and controlling the frequency and phase of the oscillations the second local oscillator 16 provides, is preferred in that alignment of the second IF signal with the second SAW filter 18 can be readily assured. The second SAW filter 18 usually includes traps for adjacent-channel signal components, in which case proper alignment of the second IF signal between these traps is important for preserving its integrity. The symbol clocking is made to exhibit a high degree of frequency stability. By locking the carrier of the final intermediate-frequency (IF) signal in frequency and phase to a submultiple of a multiple of the symbol clock frequency, the AFPC for correcting frequency and phase error in the carrier as translated to a final intermediate frequency invariably operates to correct dynamic symbol phase error as well, eliminating the need for a separate phase tracker to correct dynamic symbol phase error.

FIG. 1 denominates a digital multiplexer 55 as "AFPC selector". The multiplexer 55 responds to the pilot carrier presence detector 34 indicating that a pilot carrier is included in the currently received DTV signal for selecting, as an input signal for a digital lowpass filter 56, the imaginary output signal of the baseband response of the VSB synchrodyne circuitry 30. The response of lowpass filter 56 is a digital AFPC signal supplied as input signal to a digital-to-analog converter (DAC) 57. The output signal from the DAC 57 is an analog AFPC signal, which is subjected to further lowpass filtering in an analog lowpass filter 58, the response of which filter 58 is used for controlling the frequency and phase of the oscillations that the second local oscillator 16 provides. Analog lowpass filtering is advantageous to use for realizing long-time-constant lowpass filtering because there is reduced need for active devices as compared to digital lowpass filtering. Since the shunt capacitor of a resistance-capacitance lowpass filter section can be at the interface between a tuner 5 IC and the IC containing the digital synchrodyning circuitry, the analog lowpass filtering can be done without any cost in IC pin-out. Doing some digital lowpass filtering is advantageous, however, since the digital lowpass filter response can be subsampled to the DAC 57; the reduced speed requirements on the digital-to-analog conversion reduces the cost of the DAC 57.

The multiplexer 55 responds to the pilot carrier presence detector 34 indicating that a pilot carrier is not included in the currently received DTV signal for selecting the input signal for the digital lowpass filter 56 from the circuitry for processing a QAM DTV signal. FIG. 1 shows the product output signal of a digital multiplier 29 being provided for such selection. The digital multiplier 29 multiplies together the real and imaginary output signals of the QAM synchrodyne circuitry 25 to generate an unfiltered digital AFPC signal. The generation of the unfiltered digital AFPC signal is very similar to that in the well-known Costas loop. In the Costas loop the AFPC signal is used to control the frequency and phase of the digital local oscillations used for synchrodyning received signals to baseband. The FIG. 1 arrangement departs from this procedure, the AFPC signal being used instead to control the frequency and phase of the analog oscillations generated by the second local oscillator 16. This regulates the frequency and phase of the final IF signal supplied to the ADC 22 for digitization and for subsequent synchrodyning to baseband in the digital regime. As is the case with the Costas loop, the multiplier 29 is preferably of especial design in which the real signal is converted to a ternary signal for multiplying the imaginary signal; this simplifies the digital multiplier and improves the pull-in characteristics of the AFPC loop.

When the digital DTV receiver has its power initially turned on or when a television channel is first tuned to, the detector 34 initially conditions the DTV receiver for VSB reception, so the multiplexer 55 selects the imaginary output signal of the baseband response of the VSB synchrodyne circuitry 30 for developing AFPC signal for the second local oscillator 16. The DTV receiver is initially conditioned for VSB reception for a long enough time for the second local oscillator 16 to be brought into phase lock if a VSB signal is in fact being received, so that synchronous detection of the pilot carrier can be achieved. This helps avoid an undesirable lock-out condition in which the DTV signal receiver is conditioned for QAM reception despite a VSB signal in fact being received, in which lock-out condition the second local oscillator 16 receives improper AFPC signal so the VSB synchrodyne circuitry 30 does not synchronously detect the pilot carrier properly so as to detect a non-zero average energy condition.

The second intermediate-frequency amplifier 19, the third local oscillator 20 (except for its outboard crystal and other frequency selection components), and the third mixer 21 are advantageously constructed within the confines of a monolithic IC; since the output signal of the third mixer 21 is at a different frequency than the input signal to the second IF amplifier 19, the second IF amplifier 19 can have high gain without attendant high risk of unwanted regeneration. The first IF amplifier 14, the second local oscillator 16 (except for its outboard crystal and other frequency selection components) and the second mixer 17 can be constructed within the confines of the same IC, or they may be constructed otherwise—e.g., within other integrated circuitry. The analog-to-digital converter (ADC), as customary, will be a flash type with at least ten bits resolution and is preferably constructed within the confines of a different monolithic IC than the IF amplifiers. The analog lowpass filter at the input of the converter isolates the sampling circuitry, with its associated switching transients, from the IC in which the high-gain second IF amplifier 19 is located (and in some cases, in which the first IF amplifier 14 is also located). This reduces the likelihood of unwanted regeneration in the tuner 5. Considerable die area is required for the resistance ladder used in establishing the quantizing levels and for the large number of analog comparators involved in an ADC of flash type, so often such an ADC does not share a monolithic IC with other elements anyway.

The elements 23–35, 55 and 56 are advantageously constructed within the confines of a single monolithic integrated circuit (IC), to reduce the number of wiring connections made outside the confines of a monolithic IC. The synchrodyning circuits 25 and 30 both receive input signals from the real-to-complex sample converter 24, and portions of their respective address generators 28 and 32 can usually be provided by circuitry shared in common. It is advantageous that this single monolithic IC and the circuitry that follows this IC include all the circuitry for automatically selecting the appropriate mode of reception for the DTV transmission currently being received. Such practice avoids the need for operating the third local oscillator at two markedly different frequencies, depending on whether a DTV signal is of QAM type or is of VSB type. Operation of the third local oscillator at two markedly different frequencies is normally associated with the use of two different crystals for setting those frequencies. Operating the third local oscillator at essentially the same frequency, no matter whether the DTV signal is of QAM type or is of VSB type, saves the cost of the extra crystal and of the electronic switching circuitry involved with the use of two crystals. Furthermore, the reliability of the tuner 5 is improved by the reduction in the amount of circuitry located outside the monolithic integrated circuitry.

If the ADC is not constructed within an IC, all or substantially all its own, it is advantageous to include it in the IC that contains the circuitry for synchrodyning VSB DTV signals and the circuitry for synchrodyning QAM DTV signals to baseband, since the signals for clocking the sampling of the final IF signal by the ADC are to be generated within that IC. Furthermore, the analog lowpass filter at the input of the converter still isolates the sampling circuitry, with its associated switching transients, from the IC(s) in which high-gain IF amplification is done.

Figure 3:
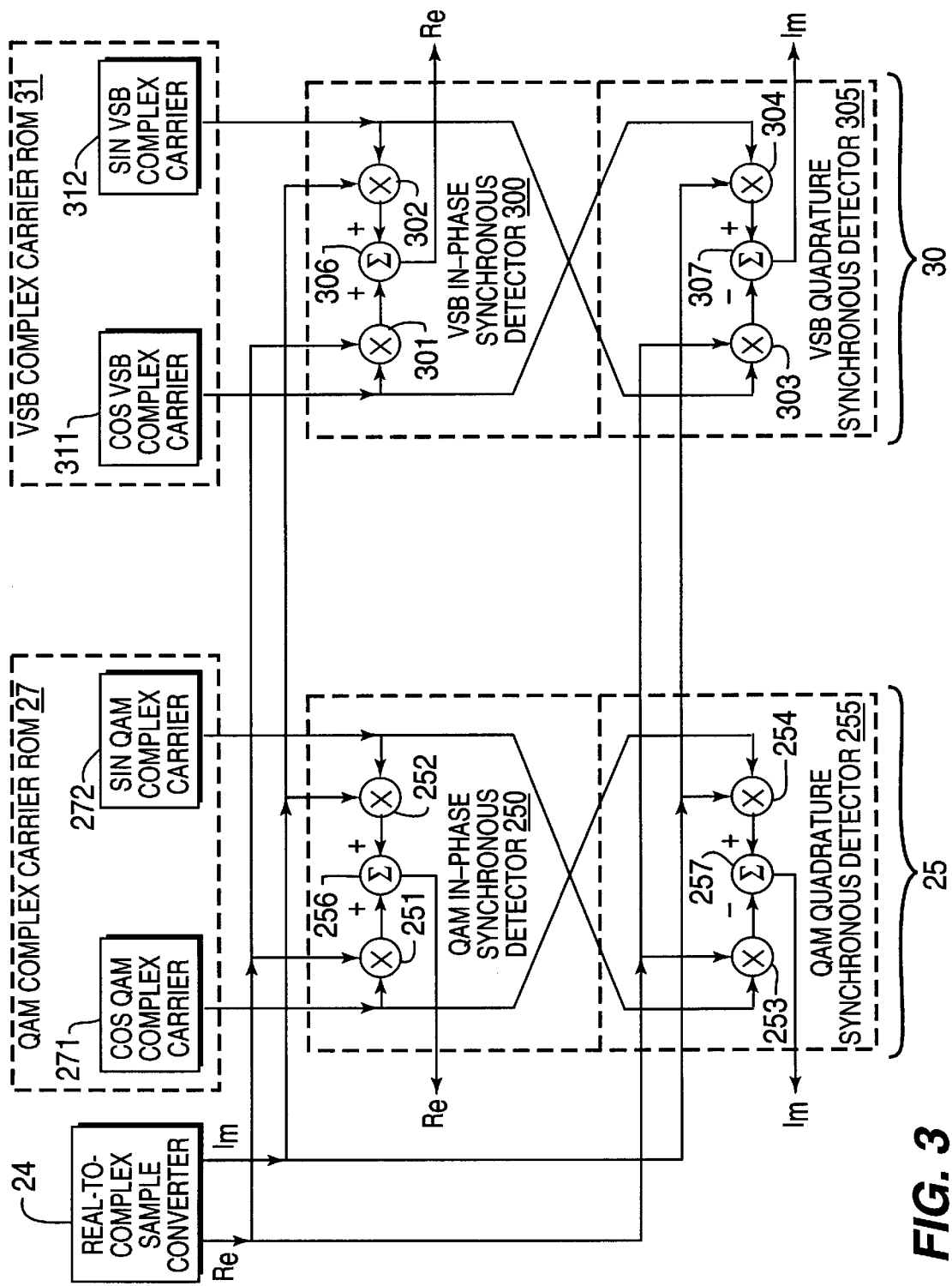
FIG. 3 is a detailed block schematic diagram of digital circuitry for synchrodyning QAM DTV signals to baseband, of digital circuitry for synchrodyning VSB DTV signals to baseband, and of circuitry associated with applying input signals to that QAM and VSB synchrodyning circuitry, as used in a DTV signal radio receiver of the type shown in FIGS. 1 and 2.

FIG. 3 shows in more detail the digital circuitry 25 for synchrodyning QAM DTV signals to baseband. The QAM synchrodyning circuitry 25 includes the QAM in-phase synchronous detector 250 for generating the real portion of its output signal and the QAM quadrature-phase synchronous detector 255 for generating the imaginary portion of its output signal. The QAM synchrodyning circuitry 25 includes a digital adder 256, a digital subtractor 257, and respective first, second, third and fourth digital multipliers 251–254. The QAM in-phase synchronous detector 250 includes the multiplier 251, the multiplier 252, and the adder 256 for adding the product output signals of the multipliers 251 and 252 to generate the real portion of the output signal of the QAM synchrodyning circuitry 25. The first digital multiplier 251 multiplies the real digital samples of final IF signal supplied from the real-to-complex-sample converter 24 by digital samples descriptive of the cosine of the QAM carrier that are read from the look-up table 271 in the ROM 27, and the second digital multiplier 252 multiplies the imaginary digital samples of final IF signal supplied from the real-to-complex-sample converter 24 by digital samples descriptive of the sine of the QAM carrier that are read from the look-up table 272 in the ROM 27. The QAM quadrature-phase synchronous detector 255 includes the multiplier 253, the multiplier 254, and the subtractor 257 for subtracting the product output signal of the multiplier 253 from the product output signal of the multiplier 254 to generate the imaginary portion of the output signal of the QAM synchrodyning circuitry 25. The third digital multiplier 253 multiplies the real digital samples of final IF signal supplied from the real-to-complex-sample converter 24 by digital samples descriptive of the sine of the QAM carrier that are read from the look-up table 272 in the ROM 27, and the fourth digital multiplier 254 multiplies the imaginary digital samples of final IF signal supplied from the real-to-complex-sample converter 24 by digital samples descriptive of the cosine of the QAM carrier that are read from the look-up table 271 in the ROM 27.

FIG. 3 also shows in more detail the digital circuitry 30 for synchrodyning VSB DTV signals to baseband. The VSB synchrodyning circuitry 30 includes the VSB in-phase synchronous detector 300 for generating the real portion of its output signal and the VSB quadrature-phase synchronous detector 305 for generating the imaginary portion of its output signal. The VSB synchrodyning circuitry 30 includes a digital adder 306, a digital subtractor 307, and respective first, second, third and fourth digital multipliers 301–304. The VSB in-phase synchronous detector 300 includes the multiplier 301, the multiplier 302, and the adder 306 for adding the product output signals of the multipliers 301 and 302 to generate the real portion of the output signal of the VSB synchrodyning circuitry 30. The first digital multiplier 301 multiplies the real digital samples of final IF signal supplied from the real-to-complex-sample converter 24 by digital samples descriptive of the cosine of the VSB carrier that are read from the look-up table 311 in the ROM 31, and the second digital multiplier 302 multiplies the imaginary digital samples of final IF signal supplied from the real-to-complex-sample converter 24 by digital samples descriptive of the sine of the VSB carrier that are read from the look-up table 312 in the ROM 31. The VSB quadrature-phase synchronous detector 305 includes the multiplier 303, the multiplier 304, and the subtractor 307 for subtracting the product output signal of the multiplier 303 from the product output signal of the multiplier 304 to generate the imaginary portion of the output signal of the VSB synchrodyning circuitry 30. The third digital multiplier 303 multiplies the real digital samples of final IF signal supplied from the real-to-complex-sample converter 24 by digital samples descriptive of the sine of the VSB carrier that are read from the look-up table 312 in the ROM 31, and the fourth digital multiplier 304 multiplies the imaginary digital samples of final IF signal supplied from the real-to-complex-sample converter 24 by digital samples descriptive of the cosine of the VSB carrier that are read from the look-up table 311 in the ROM 31.

Figure 4:
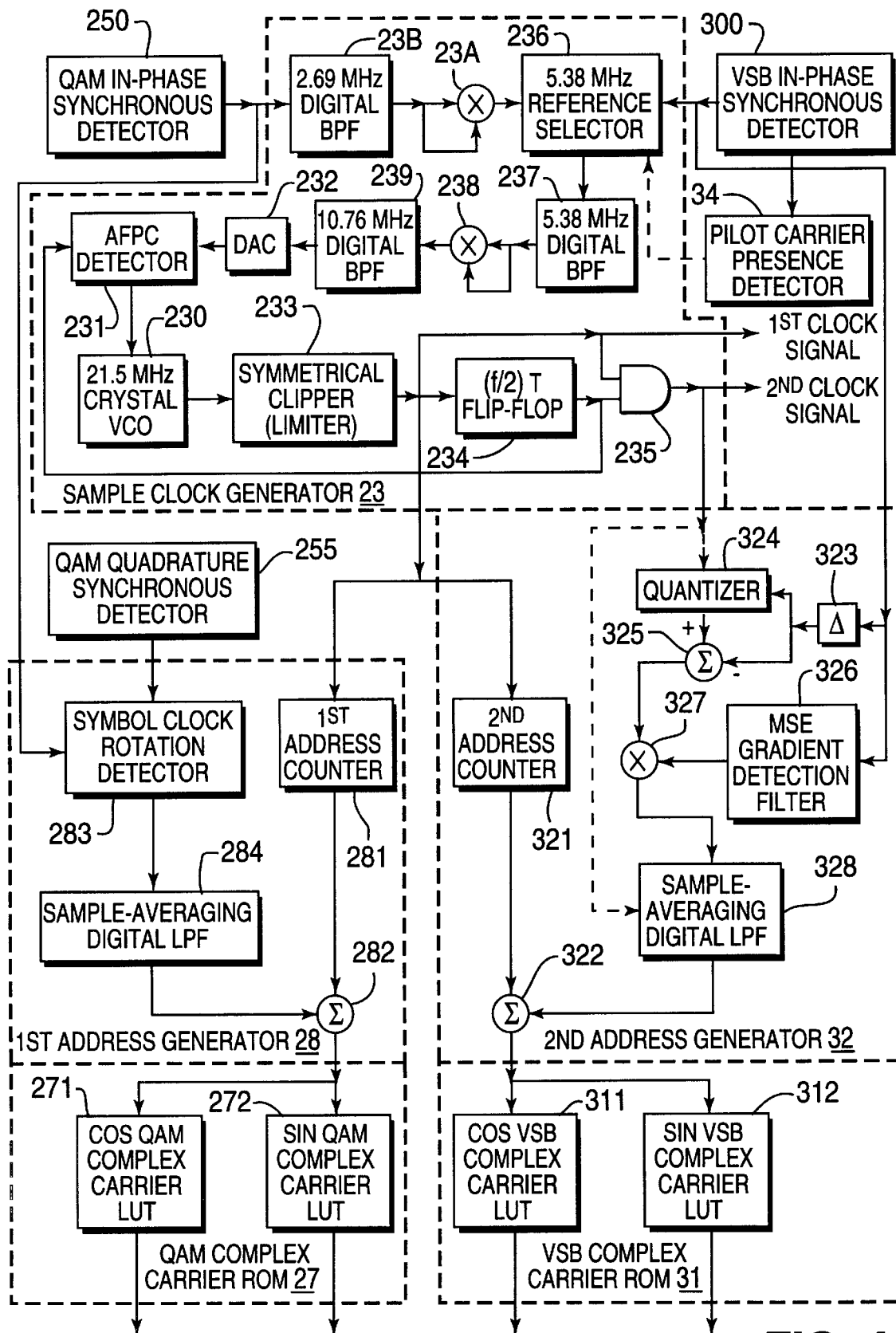
FIG. 4 is a detailed block schematic diagram of circuitry for providing the sample clock generator, the look-up table read-only memories (ROMs) for supplying digital descriptions of the complex carriers used for synchrodyning digital QAM signals and digital VSB signals at final IF signal frequencies each to baseband, and the address generators for those ROMs, which circuitry is included in certain DTV signal radio receivers of the type that can embody the invention.

FIG. 4 shows in detail a representative construction of the sample clock generator 23. This construction includes a voltage-controlled oscillator 230 that generates cissoidal oscillations nominally of 21.52 MHz frequency. The oscillator 230 is a controlled oscillator, the frequency and phase of its oscillations being controlled by an automatic frequency and phase control (AFPC) signal voltage. This AFPC signal voltage is generated by an automatic frequency and phase control (AFPC) detector 231, which compares frequency-divided response to the oscillations of the oscillator 230 with a 10.76 MHz reference carrier supplied from a digital-to-analog converter (DAC) 232. Preferably, oscillator 230 is of a type using a crystal for stabilizing the natural frequency and phase of its oscillations. A symmetrical clipper or limiter 233 generates an essentially squarewave response to these cissoidal oscillations, which is used as the first clock signal for timing the sampling of the final IF signal in the ADC 22. A frequency-divider flip-flop 234 responds to transitions of the first clock signal in a prescribed sense for generating another square wave with a fundamental frequency of 10.76 MHz, half the frequency of the oscillations of the oscillator 230. This frequency-divided response to the oscillations of the oscillator 230 is supplied to the AFPC detector 231 for comparison with the 10.76 MHz reference carrier supplied from the DAC 232. The frequency-divider flip-flop 234 also supplies squarewave output signal with a fundamental frequency of 10.76 MHz to an AND circuit 235 to be ANDed with the first clock signal for generating a second clock signal used by the 2:1 decimator 35 shown in FIG. 1.

A digital multiplexer 236 responds to the pilot carrier presence detector 34 detecting pilot carrier accompanying the received DTV signal, which is indicative that the received DTV signal is a VSB signal, to select the real samples of this signal supplied from a VSB in-phase synchronous detector 300 for application to a bandpass FIR digital filter 237 that provides a selective response centered at 5.38 MHz, which selects the first subharmonic of symbol frequency from the VSB signal. The filter 237 response is squared by a squaring circuit 238, which generates harmonics of the filter 237 response including a strong 10.76 MHz component as second harmonic of 5.38 MHz. A bandpass FIR digital filter 239 that provides a selective response centered at 10.76 MHz selects this second harmonic for application to the DAC 232 as its digital input signal descriptive of its 10.76 MHz reference carrier analog output signal.

The digital multiplexer 236 responds to the pilot carrier presence detector 34 not detecting pilot carrier accompanying the received DTV signal, which is indicative that the received DTV signal is a QAM signal, to select the output signal of a squaring circuit 23A for application to the bandpass filter 237 that provides a selective response centered at 5.38 MHz. A bandpass FIR digital filter 23B that provides a selective response centered at 2.69 MHz for selecting the 2.69 MHz first subharmonic of the symbol frequency of a baseband QAM signal supplies input signal to the squaring circuit 23A, which generates harmonics of the filter 23B response including a strong 5.38 MHz component. This baseband QAM signal can be supplied either from the QAM in-phase synchronous detector 250, as shown in FIG. 4, or from the QAM quadrature-phase synchronous detector 255.

The squaring circuit 238 is shown in FIG. 4 as a digital multiplier receiving the filter 237 response both as multiplier and multiplicand; and the squaring circuit 23A is shown as a digital multiplier receiving the filter 23B response both as multiplier and multiplicand. Each of the squaring circuits 238 and 23A can be constructed from logic gates as a digital multiplier, but for the sake of speedier operation is better provided by a ROM storing a look-up table of squares. An absolute-value circuit can be used as a substitute for the squaring circuit in generating harmonics of the response of a preceding filter, but produces weaker second harmonics and so is not preferred.

FIG. 4 also shows in more detail a representative construction of the first address generator 28, which supplies addresses to a cosine look-up table portion 271 and a sine look-up table portion 272 of the ROM 27 that provides complex-number digital descriptions of two phasings of the QAM carrier, as translated to a final intermediate frequency and in quadrature relationship with each other. Transitions of the first clock signal are counted by a first address counter 281 in the first address generator 28 to generate a basic first address signal. This basic first address signal is applied as a first summand to a digital adder 282. A first address correction signal, which is applied to the adder 282 as a second summand, adds to the basic first address signal in the adder 282 for generating as a sum output signal a corrected first address signal for addressing both the cosine look-up table portion 271 and the sine look-up table portion 272 of the ROM 27. A symbol-clock-rotation detector 283 responds to the sequence of real samples of QAM signal as synchrodyned to baseband by the QAM in-phase synchronous detector 250 and to the sequence of imaginary samples of QAM signal as synchrodyned to baseband by the QAM quadrature-phase synchronous detector 255. The symbol-clock-rotation detector 283 detects the misphasing between symbol clocking done at the receiver in accordance with the first clock signal and symbol clocking done at the transmitter, as evidenced in the received QAM signal heterodyned to a final intermediate frequency that is a submultiple of its symbol frequency. Several types of symbol-clock-rotation detector 283 are described and background literature describing certain of them are catalogued in U.S. Pat. No. 5,115,454 issued May 19, 1992 to A. D. Kucar, entitled METHOD AND APPARATUS FOR CARRIER SYNCHRONIZATION AND DATA DETECTION, and incorporated herein by reference. A digital lowpass filter 284 averages over many samples (e. g., several million) the misphasing of the symbol clocking done at the receiver as detected by the symbol-clock-rotation detector 283 to generate the first address correction signal supplied to the adder 282 to correct the basic first address. Averaging over so many samples can be done by procedures which accumulate lesser numbers of samples and dump them forward at a reduced sample rate for further accumulation, accumulation and subsampling being repeated a few times with progressively lower subsampling rates.

FIG. 4 also shows in more detail a representative construction of the second address generator 32, which supplies addresses to a cosine look-up table portion 311 and a sine look-up table portion 312 of the ROM 31 that provides complex-number digital descriptions of two phasings of the VSB carrier, as translated to a final intermediate frequency and in quadrature relationship with each other. Transitions of the first clock signal are counted by a second address counter 321 in the second address generator 32 to generate a basic second address signal. This basic second address signal is applied as a first summand to a digital adder 322. A second address correction signal, which is applied to the adder 322 as a second summand, adds to the basic second address signal in the adder 322 for generating as a sum output signal a corrected second address signal for addressing both the cosine look-up table portion 311 and the sine look-up table portion 312 of the ROM 31.

FIG. 4 shows a clocked digital delay line 323 for delaying the samples from the in-phase synchronous detector 300 by a prescribed number of sample periods prior to their being applied as input signal to a quantizer 324, which supplies the quantization level most closely approximated by the sample currently received by the quantizer 324 as input signal. The quantization levels can be inferred from the average energy of the pilot carrier accompanying the VSB signal or can be inferred from the result of envelope detection of the VSB signal. The closest quantization level selected by the quantizer 324 as its output signal has the corresponding quantizer 324 input signal subtracted therefrom by a digital adder/subtractor 325, which is operated as a clocked element by including a clocked latch at its output. The difference output signal from the adder/subtractor 325 describes the departure of the symbol levels actually recovered from those that should be recovered, but whether the polarity of the departure is attributable to symbol misphasing being leading or lagging remains to be resolved.

The samples from the in-phase synchronous detector 300 applied as input signal to the clocked digital delay line 323 are applied without delay as input signal to a mean-square-error gradient detection filter 326. The filter 326 is a finite-impulse-response (FIR) digital filter having a (−½), 1, 0, (−1), (+½) kernel, the operation of which is clocked by the first sampling clock. The prescribed number of sample periods of delay provided by the clocked digital delay line 323 is such that filter 326 response is in temporal alignment with the difference signal from the adder/subtractor 325. A digital multiplier 327 multiplies the difference signal from the adder/subtractor 325 by the filter 326 response to resolve this issue. The sign bit and the next most significant bit of the two's complement filter 326 response suffice for the multiplication, which permits simplification of the digital multiplier 327 structure. The samples of the product signal from the digital multiplier 327 are indications of the misphasing of the symbol clocking done at the receiver that are averaged over many samples (e. g., several million) by a digital lowpass filter 328 for generating the second address correction signal supplied to the adder 322 to correct the basic second address.

The symbol synchronization techniques used in the second address generator 32 shown FIG. 4 are of the same general type as S. U. H. Qureshi describes for use with pulse amplitude modulation (PAM) signals in his paper "Timing Recovery for Equalized Partial-Response Systems, IEEE Transactions on Communications, December 1976, pp. 1326–1330. These symbol synchronization techniques as used in connection with symbol synchronization for VSB signals are specifically described by the inventors in their earlier-filed applications referenced earlier in this specification. In preferred designs of the general type of second address generator 32 shown FIGS. 4 and 5, the clocked digital delay line 323 does not exist as a separate element; instead, an input signal to the quantizer 324 with the requisite number of sample periods of delay for the difference signal from the adder/subtractor 325 being temporally aligned with the filter 326 response is taken from the tapped digital delay line included in the filter 326 for supplying differentially delayed samples to be weighted by the (−½), 1, 0, (−1), (+½) kernel before being summed to generate the filter 326 response.

The carrier of a QAM DTV signal and the carrier of a VSB DTV signal are translated to respective final intermediate frequencies that are at a 2.69 MHz remove from each other, since the carrier of the QAM DTV signal is at the center of a 6-MHz-wide TV channel, but the carrier of the VSB DTV signal is only 310 kHz above the lowest frequency of a 6-MHz-wide TV channel. The frequencies of the local oscillators 11, 16 and 20 in the tuner 5 of FIG. 1 can be chosen so that the intermediate frequency to which the carrier of a VSB DTV signal is translated is higher than that to which the carrier of a QAM DTV signal is translated, with the vestigial and full sidebands of the VSB DTV signal being respectively above and below its carrier. Alternatively, the frequencies of the local oscillators 11, 16 and 20 can be chosen so that the intermediate frequency to which the carrier of a VSB DTV signal is translated is lower than that to which the carrier of a QAM DTV signal is translated, with the vestigial and full sidebands of the VSB DTV signal being respectively below and above its carrier.

Preferably the lowest frequency of the final IF signal is above 1 MHz, to keep the ratio of the highest frequency of the final IF signal thereto substantially below 8:1 and thereby ease the filtering requirements for the real-to-complex-sample converter 24. To satisfy this preference in regard to the QAM signal alone, the lowest carrier frequency for the QAM carrier in the final IF signal is 3.69 MHz. To satisfy this preference in regard to the VSB signal alone, the lowest the carrier frequency for the VSB carrier in the final IF signal could be is 1.31 MHz, presuming its full sideband to be above its vestigial sideband in frequency, or 6.38 MHz, presuming its full sideband to be below its vestigial sideband in frequency. Presuming the full sideband of the VSB signal to be above its vestigial sideband in frequency, since the carrier frequency of the VSB carrier most be at least 1.31 MHz, the carrier frequency of the QAM carrier must be at least 4.00 MHz. Presuming the full sideband of the VSB signal to be below its vestigial sideband in frequency, since the carrier frequency of the VSB carrier most be at least 6.38 MHz, the carrier frequency of the QAM carrier must still be at least 3.69 MHz.

Figure 11:
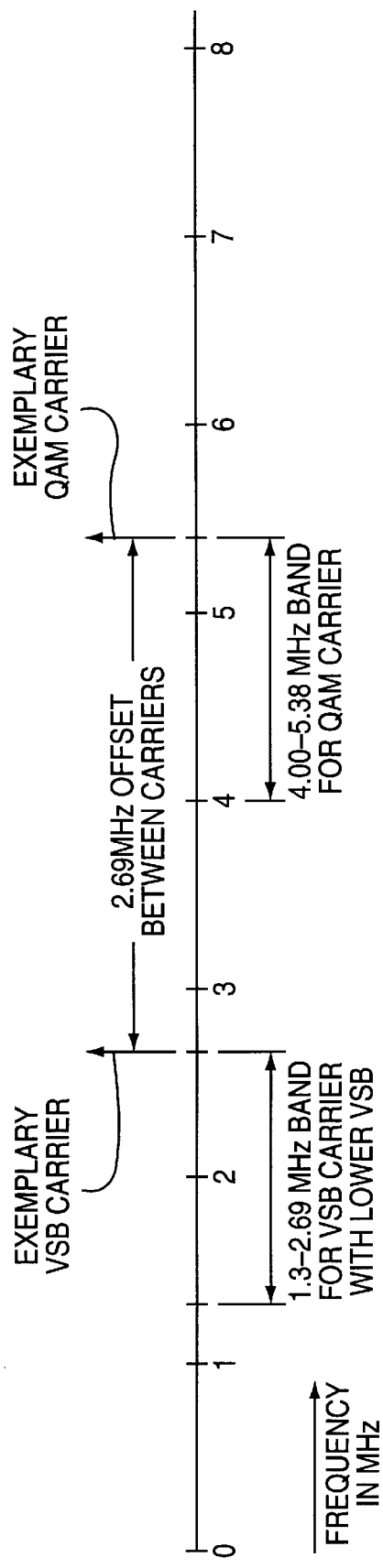
FIG. 11 is a graph of the constraints on the final intermediate frequencies to which the carriers of a QAM DTV signal and a VSB DTV signal can be frequency translated, when the carrier of a VSB DTV signal is lower in frequency than the carrier of a QAM DTV signal in the final IF signal, so the full sideband of the VSB DTV signal is higher in frequency than its vestigial sideband in the final IF signal, and when the sample rate during digitization is constrained to $21.52 * 10^6$ samples per second.

If the sample rate in the ADC 22 is established by the first clock signal from the sample clock generator 23 to be 21.52 * $10^6$ samples per second, preferably the intermediate frequency to which the carrier of a QAM DTV signal is translated is not higher than 5.38 MHz, so that it can be sampled at least four times per cycle. Presuming the full sideband of the VSB signal to be above its vestigial sideband in frequency, this preference constrains the lowest frequency in the final IF signal to being no higher than 2.38 MHz and the carrier of the VSB signal being no higher than 2.69 MHz. FIG. 11 illustrates how, for these presumed conditions, the VSB carrier is constrained to the band 1.31–2.69 MHz, and the QAM carrier is constrained to the band 4.00–5.38 MHz.

Figure 12:
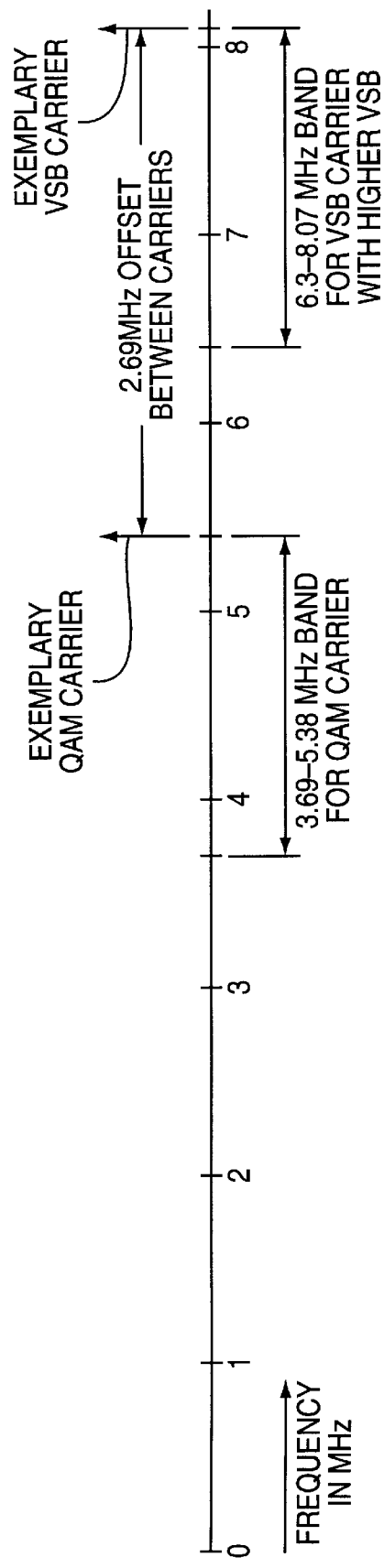
FIG. 12 is a graph of the constraints on the final intermediate frequencies to which the carriers of a QAM DTV signal and a VSB DTV signal can be frequency translated, when the carrier of a VSB DTV signal is higher in frequency than the carrier of a QAM DTV signal in the final IF signal, so the full sideband of the VSB DTV signal is lower in frequency than its vestigial sideband in the final IF signal, and when the sample rate during digitization is constrained to $21.52 * 10^6$ samples per second.

Presuming the full sideband of the VSB signal to be below its vestigial sideband in frequency, the QAM carrier is constrained to the band 3.69–5.38 MHz. Accordingly, the carrier of the VSB signal is constrained to the band 6.38–8.07 MHz in order that the 2.69 MHz offset between carriers is maintained. FIG. 12 illustrates the case where the QAM carrier is constrained to the band 3.69–5.38 MHz and the VSB carrier is constrained to the band 6.38–8.07 MHz.

The final intermediate frequency to which the QAM carrier is translated must be a submultiple of a multiple of the 21.52 MHz sampling rate in order that this carrier can be described on a continuous basis relying on a sine-cosine look-up table in the ROM 27. The final intermediate frequency to which the VSB carrier is translated must be a submultiple of a multiple of the $21.52 * 10^6$ samples-per-second sampling rate in order that this carrier can be described on a continuous basis relying on a sine-cosine look-up table in the ROM 31. The final intermediate frequency (m/n) times the 21.52 MHz sampling rate, to which the carrier is translated, preferably has a small value of n, to keep the number of values in the sine-cosine look-up tables stored in ROM reasonably small.

One can search for respective intermediate frequencies to which the carrier of a QAM DTV signal and the carrier of a VSB DTV signal are to be translated, which frequencies meet the criteria set forth above, by following procedure taught in U.S. Pat. No. 5,506,636. A table of subharmonics of successive harmonics of the 10.76 MHz VSB symbol rate, which the sampling clock rate is harmonically related to, is constructed for the frequency ranges of interest. Then pairs of subharmonics of the same harmonic which exhibit the desired 2.69 MHz difference in frequency between them are considered with regard to their relative advantages as carriers.

The third and seventh subharmonics of 21.52 MHz at 5.38 MHz and at 2.39 MHz exhibit substantially the desired 2.69 MHz offset and are appropriate for use as QAM carrier and a VSB carrier with its full sideband above its vestigial sideband in frequency. The 2.69 MHz offset between these subharmonics is one-quarter the symbol rate of 10,762237.762 samples per second, or 2,690559.4 Hz, rather than the 2,690,122.4 Hz offset between the QAM and VSB carriers required to offset the VSB carrier from a co-channel interfering NTSC video carrier by 59.75 times the nominal NTSC horizontal scanning frequency. This small 437 Hz frequency discrepancy is easily accommodated by the automatic frequency and phase control of the controlled local oscillator 16 in the tuner 5 of FIG. 1. The addressing of ROMs 27 and 31 is greatly simplified when the QAM and VSB carriers are translated to be close to the third and seventh subharmonics of 21.52 MHz in final IF signals, since advantage can be taken of repetitive symmetries in the stored sine and cosine functions, to reduce the number of bits in the addresses applied to ROM.

The second harmonic of the 21.52 MHz sampling frequency is 43.05 MHz, and its subharmonics can be searched, looking for a pair offset from each other in frequency by an amount substantially equal to 2.69 MHz. The seventh and fifteenth subharmonics of 43.05 MHz are the third and seventh subharmonics of 21.52 MHz which have already been considered. The ninth and twenty-sixth subharmonics of 43.05 MHz at 4.305 MHz and at 1.594 MHz exhibit a 20 kHz or 0.74% error in regard to the desired 2.69 MHz offset and could respectively serve as QAM carrier and as VSB carrier. This error is within the 30 kHz or so mistuning tolerated in past commercial designs for NTSC TV receivers. The ROM 31 storing sine-cosine look-up tables for the twenty-sixth subharmonic of 43.05 MHz has to store an excessive number of samples, however; and the ROM 27 storing sine-cosine look-up tables for the ninth subharmonic of 43.05 MHz has to store an appreciable number of samples, too.

The third harmonic of the 21.52 MHz sampling frequency is 64.57 MHz, and its subharmonics can be searched, looking for a subharmonic offset in frequency from a subharmonic of 43.05 MHz or from another subharmonic of 64.57 MHz by an amount substantially equal to 2.69 MHz. The twelfth subharmonic of 64.57 MHz, 4.967 MHz, and the eighteenth subharmonic of 43.05 MHz, 2.265 MHz, exhibit a 12 kHz or 0.45% error in regard to the desired 2.69 MHz offset and could respectively serve as QAM carrier and as a VSB carrier with its full sideband above its vestigial sideband in frequency. This error is well within the 30 kHz or so of mistuning tolerated in past commercial designs for NTSC TV receivers. However, the ROM 27 storing sine-cosine look-up tables for the twelfth subharmonic of 64.57 MHz has to store an excessive number of samples; and the ROM 31 storing sine-cosine look-up tables for the eighteenth subharmonic of 43.05 MHz has to store an excessive number of samples, too.

The seventh subharmonic of 64.57 MHz is 8.07 MHz, offset almost exactly the desired 2.69 MHz from the third subharmonic of 21.52 MHz. This third subharmonic of 21.52 MHz, 5.38 MHz, and the seventh subharmonic of 64.57 MHz, 8.07 MHz, are appropriate for use as QAM carrier and a VSB carrier with its full sideband below its vestigial sideband in frequency.

It appears preferable that the frequencies of the local oscillators 11, 16 and 20 in the tuner 5 of FIG. 1 be chosen so that the intermediate frequency to which the carrier of a QAM DTV signal is translated is 5.38 MHz, the presumed symbol rate for the QAM DTV signal and half the standard symbol rate for the VSB DTV signal. Accordingly, if the VSB carrier is translated in frequency so as to have its full sideband above its vestigial sideband in frequency in the final IF signal, the preferred frequency of the VSB carrier in the final IF signal is 2.69 MHz. Alternatively, if the VSB carrier is translated in frequency so as to have its full sideband below its vestigial sideband in frequency in the final IF signal, the preferred frequency of the VSB carrier in the final IF signal is 8.07 MHz.

It is noted in passing that all the subharmonics of 43.05 MHz and all the subharmonics of 64.57 MHz are subharmonics of 129.15 MHz, the third harmonic of 43.05 MHz and the second harmonic of 64.57 MHz. The 2.69 MHz, 5.68 MHz and 8.07 MHz frequencies are the forty-seventh, twenty-third and fifteenth subharmonics, respectively, of 129.15 MHz. It is also noted that while the harmonic relationship between carriers have been considered in terms of harmonics of the 21.52 MHz sampling rate that is the second harmonic of the 10.76 MHz VSB symbol rate, the consideration thusfar can be viewed as involving the even harmonics of the 10.76 MHz symbol rate. A more complete consideration of the possible harmonic relationships between carriers also includes consideration of odd harmonics, at least third, of the 10.76 MHz VSB symbol rate. The 2.69 MHz, 5.68 MHz and 8.07 MHz frequencies are respectively the eleventh, fifth and third subharmonics of 32.29 MHz, 32.29 MHz being three times the 10.76 MHz symbol rate of the VSB signal.

One skilled in the art of designing analog-to-digital conversion circuitry for digital systems will appreciate that the sampling of analog signals for digitization can use various widths of sampling window. Thusfar, it has been presumed that $21.52 * 10^6$ samples per second are taken with the duration of each sampling window extending over half a cycle of 21.52 MHz. The pulses from the limiter 233 can be stretched to nearly twice this duration, if desired. Another alternative that is possible is to design the analog-to-digital converter to use two staggered sets of sampling windows with each sampling window extending over half a cycle of 21.52 MHz and to digitize on a staggered-phase basis at a $43.05 * 10^6$ samples per second combined rate. The digitization of final IF signal at a $43.05 MHz * 10^6$ samples per second improves automatic phase and frequency control accuracy.

Figure 5:
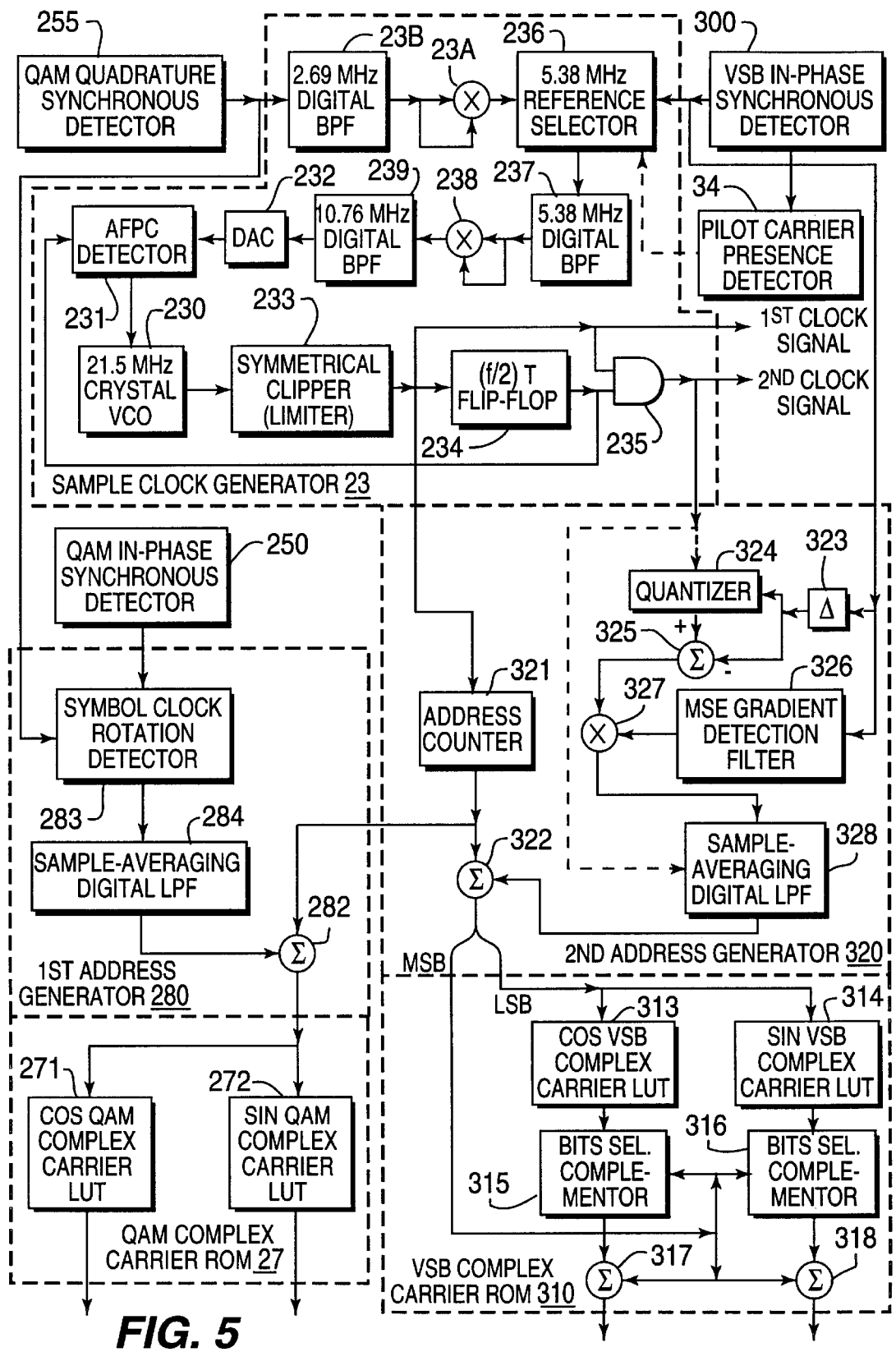
FIG. 5 is a detailed block schematic diagram of circuitry similar to that of FIG. 4, modified so that the address generator for the ROMs supplying digital descriptions of the complex carrier used for synchrodyning digital QAM signals to baseband and the ROMs supplying digital descriptions of the complex carrier used for synchrodyning digital VSB signals to baseband share an address counter in common.

FIG. 5 shows a modification of the FIG. 4 circuitry that is possible when the third and the seventh subharmonics of 21.52 MHz are used as the final intermediate frequencies to which the QAM and VSB DTV carriers are respectively converted. In a modification 320 of the second address generator 32 described above, second address counter 321 is arranged to count modulo eight when sampling rate is $21.52 * 10^6$ samples per second, thereby to generate two cycles of ROM 27 addressing and the one cycle of addressing for a ROM 310 that replaces the ROM 31; and the less significant bits of the output count from the second address counter 321 are made available for replacing the basic first address from the first address counter 281. In a modification 280 of the first address generator 28 described above, the first address counter 281 is dispensed with, and the less significant bits of the second address counter 321 are applied to the adder 282 as basic first address instead of the count from the first address counter 281. The VSB complex carrier ROM 31 is replaced with a ROM 310 that comprises a portion 313 that stores only one-half cycle of VSB carrier cosine values and a portion 314 that stores only one-half cycle of VSB carrier sine values. These portions 313 and 314 of the ROM 310 are addressed by the less significant bits of the adder 322 sum output signal. A selective bits complementor 315 exclusive-ORs the most significant bit of the adder 322 sum output signal with each of the bits of the VSB carrier cosine values read from the portion 313 of the ROM 310 for generating a first summand input for a digital adder 317, and the most significant bit of the adder 322 sum output signal is provided with zero extension in the direction of increased significance for generating a second summand input for the adder 317. The sum output from the adder 317 provides eight cosine values of VSB carrier over eight first clock periods to define a complete cycle of VSB carrier. A selective bits complementor 316 exclusive-ORs the most significant bit of the adder 322 sum output signal with each of the bits of the VSB carrier sine values read from the portion 314 of the ROM 310 for generating a first summand input for a digital adder 318, and the most significant bit of the adder 322 sum output signal with zero extension in the direction of increased significance is also applied as a second summand input for the adder 318. The sum output from the adder 318 provides eight sine values of VSB carrier over eight first clock periods to define a complete cycle of VSB carrier.

The FIG. 5 or the FIG. 4 circuitry can also be used when the fifth and third subharmonics of 32.29 MHz are used as the final intermediate frequencies to which the QAM and VSB DTV carriers are respectively converted. The contents of the portions 313 and 314 of the ROM 310 are modified for the higher-frequency 8.07 MHz VSB carrier, of course.

One skilled in the art of digital circuit design will understand that other hardware savings can be made in the FIG. 4 read-only memory circuitry taking advantage of symmetries in the cosine and sine functions or the 90° offset in the respective phases of these two functions. One skilled in the art of digital circuit design and acquainted with the foregoing description will understand that modifications of the FIG. 4 and FIG. 5 circuitry are possible that have an AFPC detector for the VCO 230 in which the oscillations from the VCO 230 as converted to square waves by the symmetrical clipper 233 are compared in frequency with frequency doubler response to the 10.76 MHz signal selected by the digital bandpass filter 237.

One skilled in the art of digital circuit design will be enabled by acquaintance with the foregoing description to implement circuitry in which the ADC 22 samples at a $43.05 * 10^6$ samples per second sample rate during digitization. The VCO 230 is replaced by a VCO supplying 43.05 MHz oscillations; and, by way of example, oscillations from the VCO 230 as converted to square waves by the symmetrical clipper 233 and frequency divided by the flip-flop 234 are compared in frequency with frequency doubler response to the 10.76 MHz signal selected by the digital bandpass filter 237. The 2:1 decimator 35 can be replaced by a 4:1 decimator, and the squarewave output signal from the flip-flop 234 can be divided by another factor of two by a further flip-flop to provide support for generating a reduced-rate sample clock signal for the 4:1 decimator.

Figure 6:
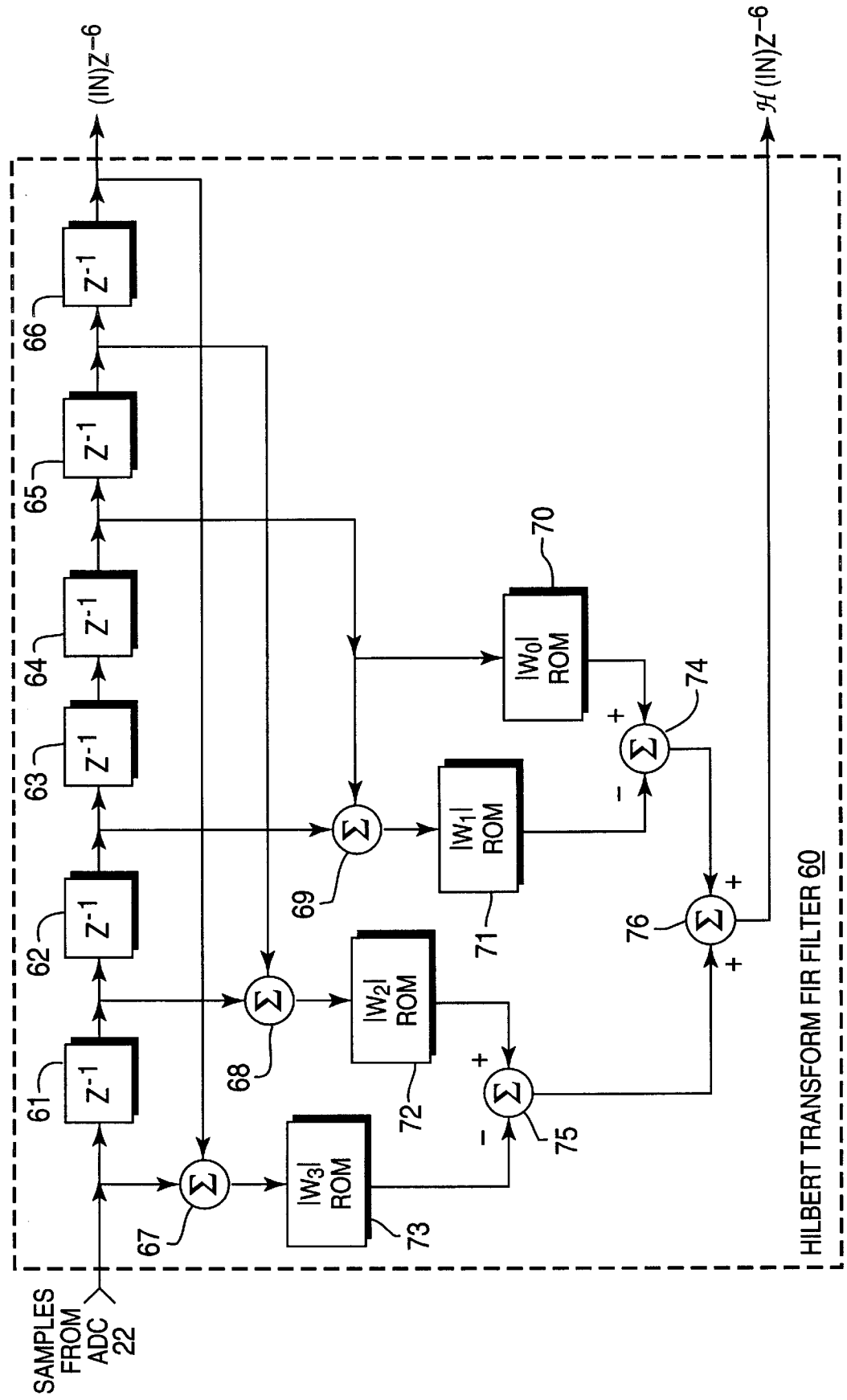
FIG. 6 is a detailed block schematic diagram of circuitry for converting digital samples to complex form in DTV signal radio receivers embodying the invention, which circuitry includes a Hilbert transformation filter for generating imaginary samples from real samples, and which includes delay compensation for the real samples equivalent to the latency of that filter.

FIG. 6 shows a form that the circuitry 24 can take, which comprises:

(a) a linear-phase, finite-impulse-response (FIR) digital filter 60 that generates imaginary (Im) digital samples as a Hilbert transform response to the real (Re) digital samples; and (b) compensating, clocked digital delay of the real digital samples to compensate for the latency time of the Hilbert transformation filter 60, which clocked digital delay can be provided by clocked latch elements 61–66 included in the Hilbert transformation filter 60.

The use of such circuitry for implementing in-phase and quadrature-phase sampling procedures on bandpass signals is described by D. W. Rice and K. H. Wu in their article "Quadrature Sampling with High Dynamic Range" on pp. 736–739 of IEEE TRANSACTIONS ON AEROSPACE AND ELECTRONIC SYSTEMS, Vol. AES-18, No. 4 (November 1982). Since the frequency band 6 MHz wide occupied by the final IF signal has a lowest frequency of at least a megaHertz or so, it is possible to use as few as seven non-zero-weighted taps in the FIR filter 60 used for Hilbert transformation.

The seven-tap Hilbert transformation filter 60 includes a cascade connection of one-sample delay elements 61, 62, 63, 64, 65 and 66 from which samples taken to be weighted and summed to generate the Hilbert transform response. The Hilbert transform is linear phase in nature so the tap weights of the FIR filter 60 exhibit symmetry about median delay. Accordingly, a digital adder 67 sums the input signal to delay element 61 and the output signal from the delay element 66 to be weighted in common, a digital adder 68 sums the output signal from the delay element 61 and the output signal from the delay element 65 to be weighted in common, and a digital adder 69 sums the output signal from the delay element 62 and the output signal from the delay element 64 to be weighted in common. The output signal from the delay element 64 is applied as input address to a read-only memory 70, which multiplies that signal by an appropriate weight $W_0$ magnitude. The sum output signal from the digital adder 69 is applied as input address to a read-only memory 71, which multiplies that signal by an appropriate weight $W_1$ magnitude. The sum output signal from the digital adder 68 is applied as input address to a read-only memory 72, which multiplies that signal by an appropriate weight $W_2$ magnitude. The sum output signal from the digital adder 67 is applied as input address to a read-only memory 73, which multiplies that signal by an appropriate weight $W_3$ magnitude. The use of the ROMs 70, 71, 72 and 73 as fixed-multiplicand multipliers keeps the delay associated with multiplication negligibly short. The output signals of the ROMs 70, 71, 72 and 73 are combined by a tree of signed digital adders 74, 75 and 76 operated as adders or subtractors, as required to appropriately assign signs to the magnitudes of the weights $W_0$, $W_1$, $W_2$ and $W_3$ stored in the ROMs 70, 71, 72 and 73. The adders 67, 68, 69, 74, 75 and 76 are assumed to be clocked adders each exhibiting one-sample latency, which results in the seven-tap FIR filter 60 exhibiting a six-sample latency. Delay of the filter 60 input signal that compensates for this latency is provided by the cascade connection of the six one-sample delay elements 61, 62, 63, 64, 65 and 66. The input address to the read-only memory 70 is taken from the output of the delay element 65, rather than from the output of the delay element 63, so the one-sample delay of delay element 64 compensates for the one-sample delays in the adders 67, 68 and 69.

C. M. Rader in his article "A Simple Method for Sampling In-Phase and Quadrature Components", IEEE TRANSACTIONS ON AEROSPACE AND ELECTRONIC SYSTEMS, Vol. AES-20, No. 6 (November 1984), pp. 821–824, describes improvements in complex synchronous detection carried out on digitized bandpass signals. Rader replaces the Hilbert-transform FIR filter and the compensating-delay FIR filter of Rice and Wu with a pair of all-pass digital filters designed based on Jacobian elliptic functions and exhibiting a constant /2 difference in phase response for the digitized bandpass signals. A preferred pair of such all-pass digital filters, which are of infinite-impulse-response (IIR) type, has the following system functions:

$$H_1(z) = z^{-1}(z^{-2} - a^2)/(1 - a^2 z^{-2}) \quad a^2 = 0.5846832$$

$$H_2(z) = -(z^{-2} - b^2)/(1 - b^2 z^{-2}) \quad b^2 = 0.1380250$$

Rader describes filter configurations which require only two multiplications, one by $a^2$ and one by $b^2$.

Figure 7:
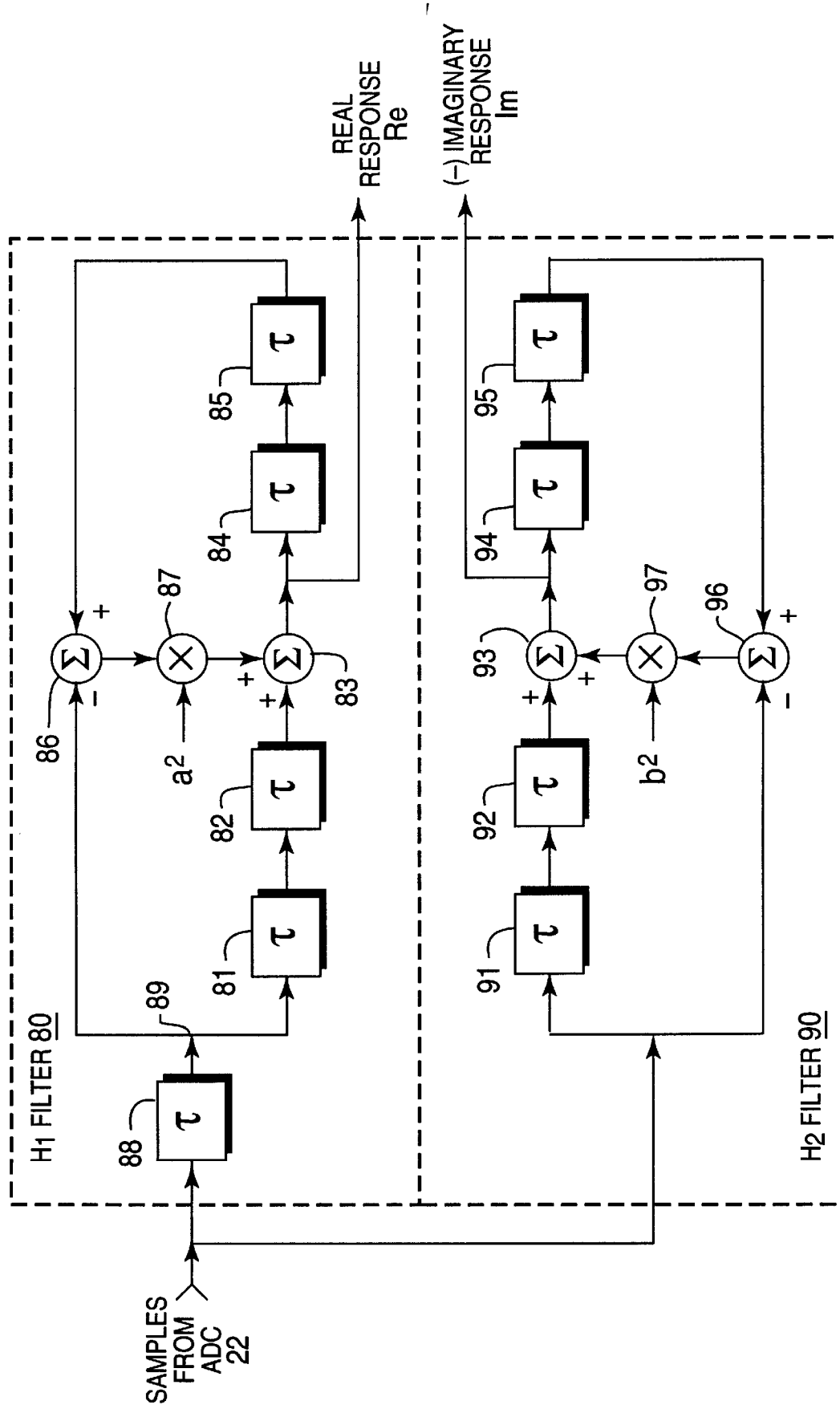
FIG. 7 is a detailed block schematic diagram of a pair of all-pass digital filters of infinite-impulse-response (IIR) type designed based on Jacobian elliptic functions and exhibiting a constant $\pi/2$ difference in phase response for the digitized bandpass signals, as can be employed for converting digital samples to complex form in DTV signal radio receivers embodying the invention.

FIG. 7 shows an alternative form that the circuitry 24 can take, which comprises a pair of all-pass digital filters 80 and 90 of a type described by C. M. Rader and designed based on Jacobian elliptic functions. The filters 80 and 90 exhibit a constant /2 difference in phase response for digitized bandpass signals. Since oversampled real samples better provide for symbol synchronization when synchrodyning VSB signals, the inventors prefer not to use the all-pass filters also described by Rader that exploit sub-sampling to provide further reductions in the delay network circuitry.

The construction of the filter 80, which provides the system function $H_1(z)=z^{-1}(z^{-2}-a^2)/(1-a^2z^{-2})$, where $a^2=0.5846832$ in decimal arithmetic, is shown in FIG. 7 to be as follows. The samples from the ADC 22 are delayed by one ADC sample clock duration in a clocked delay element 88 for application to a node 89. The signal at node 89 is further delayed by two ADC sample clock durations in cascaded clocked delay elements 81 and 82, for application as first summand signal to a digital adder 83. The sum output signal of the adder 83 provides the real response from the filter 80. The sum output signal of the adder 83 is delayed by two ADC sample clock durations in cascaded clocked delay elements 84 and 85, for application as minuend input signal to a digital subtractor 86 that receives the signal at node 89 as its subtrahend input signal. The resulting difference output signal from the digital subtractor 86 is supplied as multiplier input signal to a digital multiplier 87 for multiplying an $a^2$ multiplicand signal, using a binary arithmetic. The resulting product output signal is applied to the digital adder 83 as its second summand signal.

The construction of the filter 90, which provides the system function $-H_2(z)=(z^{-2}-b^2)/(1-b^2z^{-2})$, where $b^2=0.1380250$ in decimal arithmetic, is shown in FIG. 7 to be as follows. The samples from the ADC 22 are delayed by two ADC sample clock durations in cascaded clocked delay elements 91 and 92, for application as first summand signal to a digital adder 93. The sum output signal of the adder 93 provides the imaginary response from the filter 90. The sum output signal of the adder 93 is delayed by two ADC sample clock durations in cascaded clocked delay elements 94 and 95, for application to a digital subtractor 96 as its minuend signal. The subtractor 96 receives the samples from the ADC 22 as its subtrahend input signal. The resulting difference output signal from the digital subtractor 96 is supplied as multiplier input signal to a digital multiplier 97 for multiplying a $b^2$ multiplicand signal, using a binary arithmetic. The resulting product output signal is applied to the digital adder 93 as its second summand signal.

Figure 8:
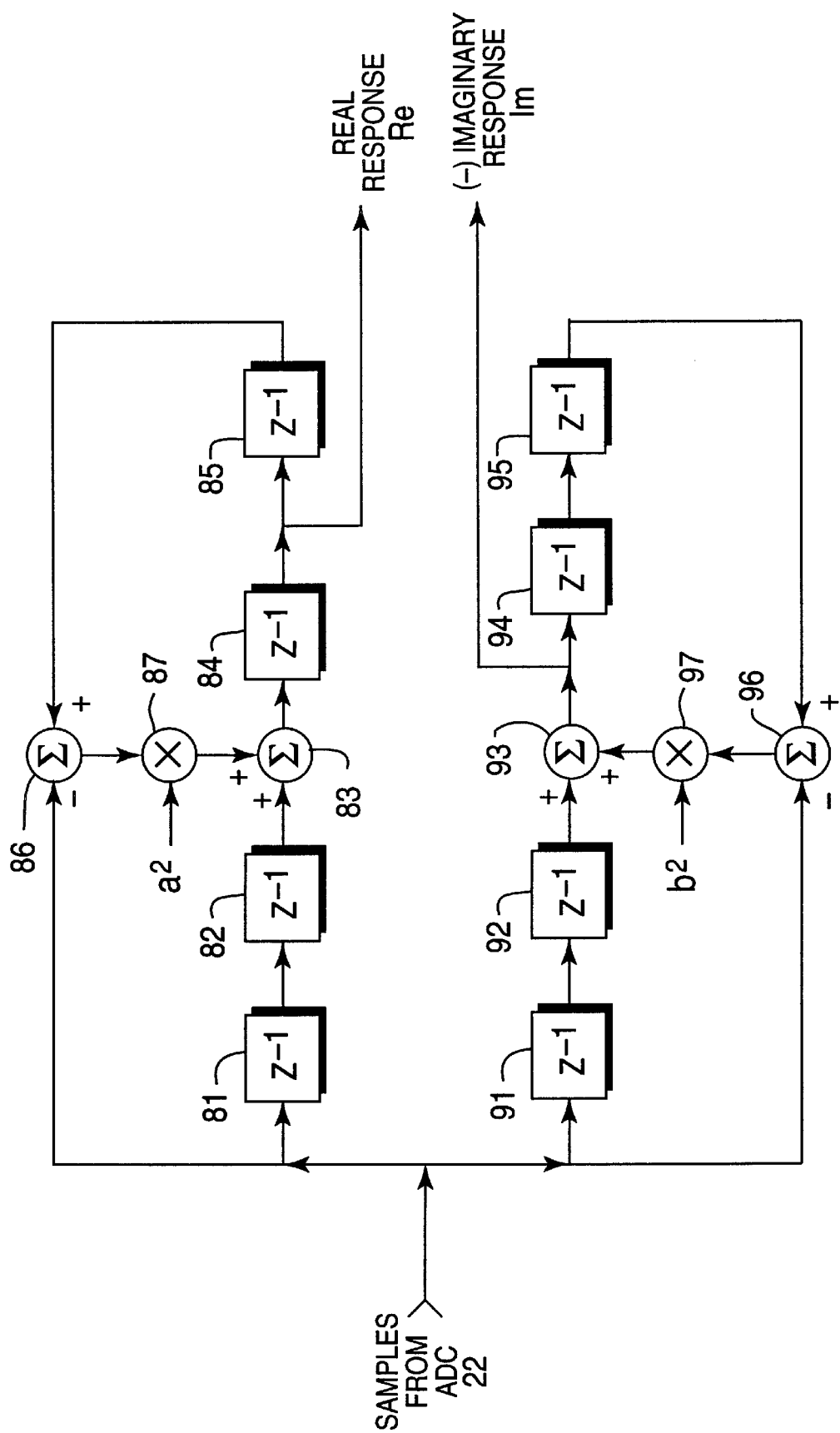
FIGS. 8 and 9 are block schematic diagrams of changes that can be made the filter circuitry of FIG. 7 to remove redundant delay.

FIG. 8 shows a complex-signal filter resulting from modifying the FIG. 7 complex-signal filter as follows. The position of the clocked delay element 88 is shifted so as to delay the sum output signal of the adder 83, rather than to delay the digital output signal of the ADC 22, and the digital output signal of the ADC 22 is applied to the node 89 without delay, thereby to cause real response to be provided at the output port of the shifted-in-position clocked delay element 88. The real response provided at the output port of the shifted-in-position clocked delay element 81 is the same as the response provided at the output port of the clocked delay element 84. So, the real response is provided from the output port of the clocked delay element 84 instead of from the output port of the shifted-in-position clocked delay element 81; and the shifted-in-position clocked delay element 81, being no longer required, is dispensed with.

Figure 9:
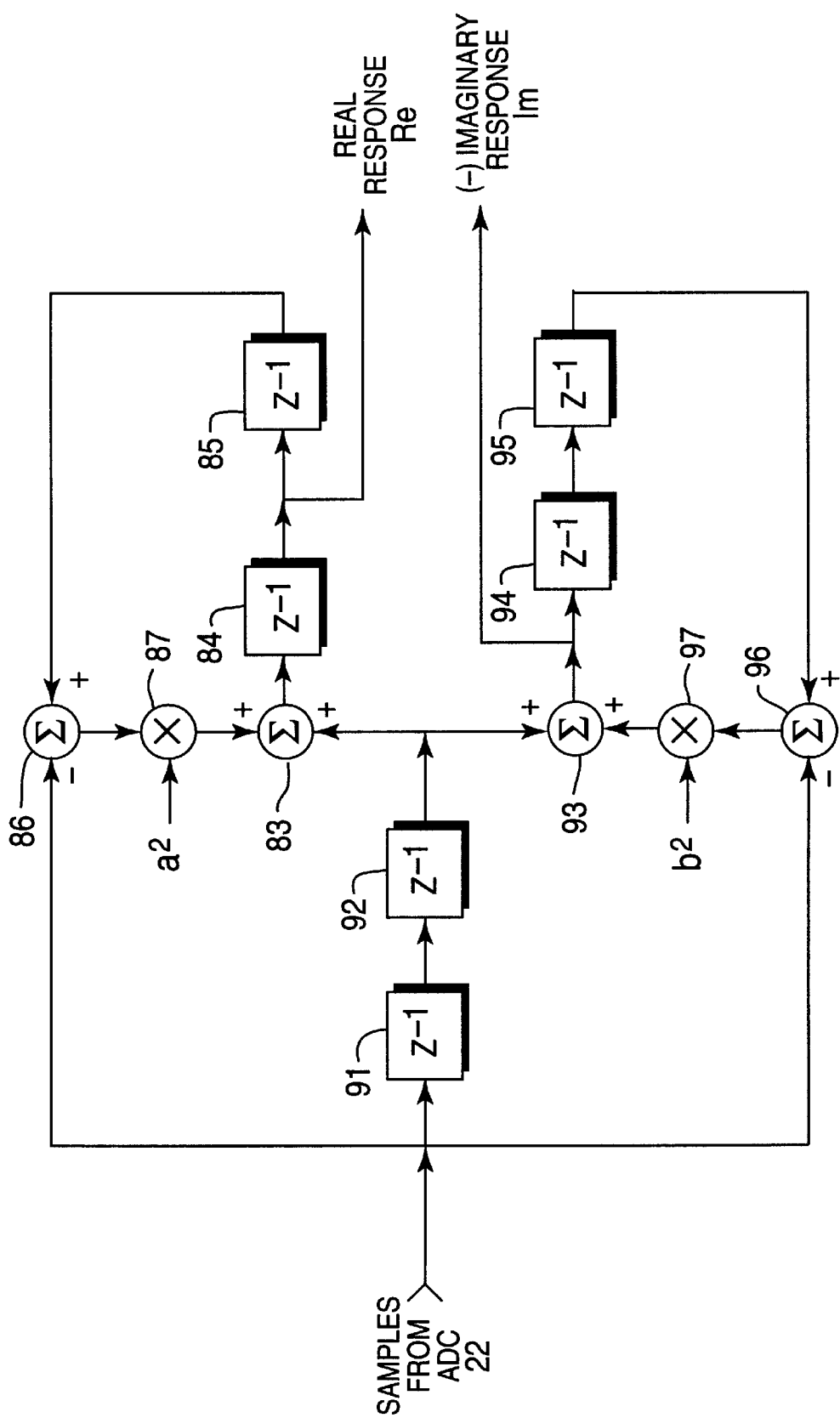

FIG. 9 shows a complex-signal filter resulting from modifying the FIG. 8 complex-signal filter as follows. The first summand signal for the adder 83 is then taken from the cascaded clocked delay elements 91 and 92, rather than from the cascaded clocked delay elements 81 and 82. The cascaded clocked delay elements 81 and 82, being no longer required, are dispensed with. The FIG. 9 complex-signal filter is preferred over the complex-signal filters of FIG. 7 and 8 in that redundant clocked delay elements are eliminated.

Figure 10:
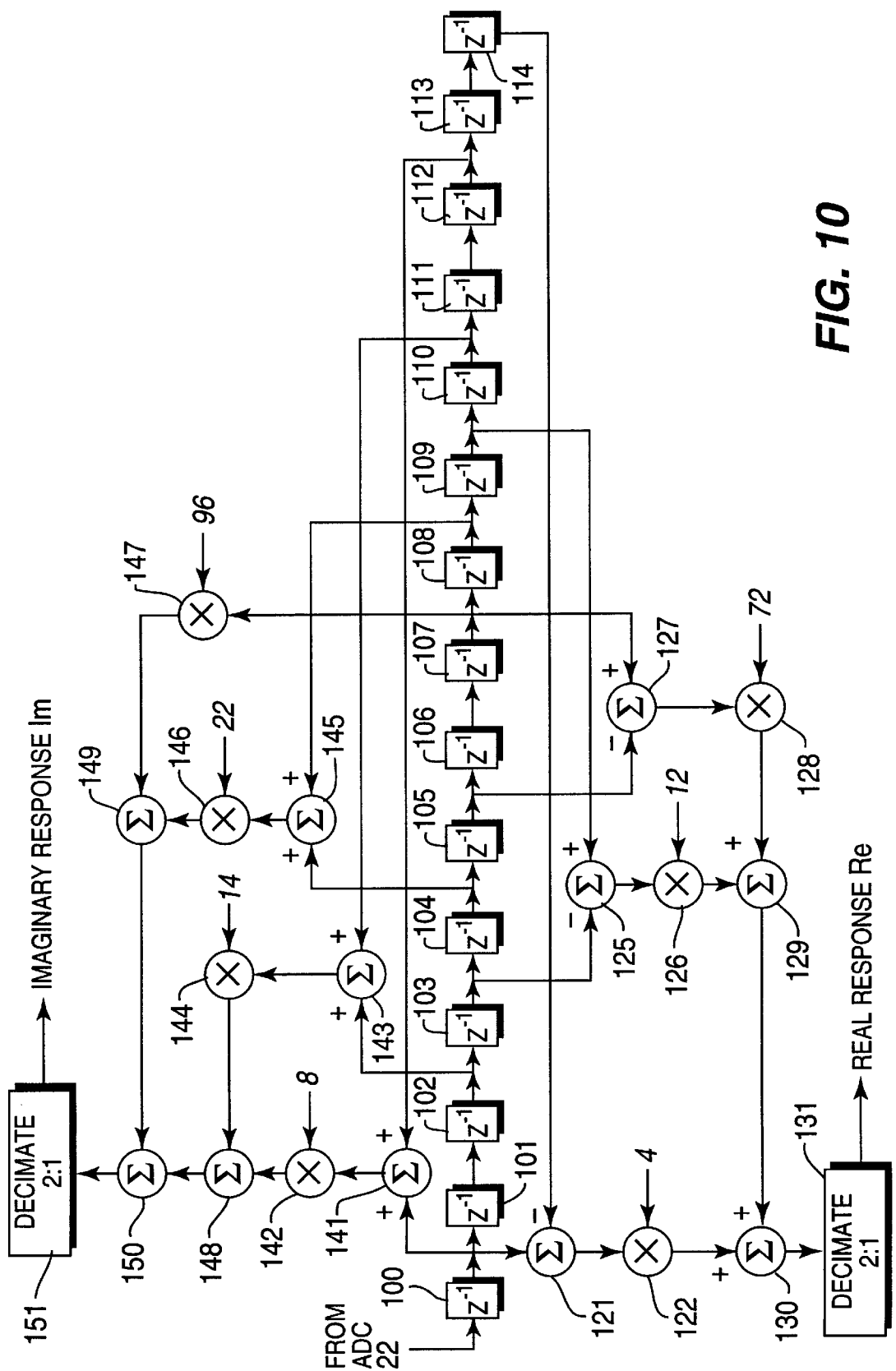
FIG. 10 is a detailed block schematic diagram of a pair of all-pass digital filters of finite-impulse-response (FIR) type exhibiting a constant $\pi/2$ difference in phase response for the digitized bandpass signals, as can be employed for converting digital samples to complex form in DTV signal radio receivers embodying the invention.

FIG. 10 is a detailed block schematic diagram of a complex-signal filter developing a constant /2 difference in phase between a real response Re and an imaginary response Im to the digitized bandpass signals, that is similar the complex-signal filter described by T. F. S. Ng in United Kingdom patent application 2 244 410 A published Nov. 27, 1991 and entitled QUADRATURE DEMODULATOR. The Ng filters are finite-impulse-response (FIR) digital filters, rather than IIR filters as described by Rader. The FIG. 10 complex-signal filter differs from the filters described by Ng in that 2:1 decimation is done following filtering, rather than before.

This permits the real and imaginary filtering to be supported by a shared tapped delay line. FIG. 10 shows this shared tapped delay line composed of cascaded single-clock-delay elements 100–114, such as latches that like the ADC 22 are clocked at four times symbol transmission rate. The single-clock-delay element 100 may be dispensed with or subsumed into the ADC 22 in some designs. Digital adders and subtractors in the FIG. 6 complex filter are assumed to be clocked at four times symbol transmission rate, with each having a single-clock-duration latency. The digital multipliers are assumed to be a wired place shift in the case of a multiplication by an integral power of two or to be provided from read-only memory (ROM), so there is zero latency in each of the multiplications insofar as clocked operation is concerned. At least the eight-bit resolution in the filter results per Ng is presumed.

In order to generate the real response $H_1(z)$, the real-response filter is presumed to apply tap weights $W_0=4$, $W_1=0$, $W_2=-12$, $W_3=-72$, $W_4=72$, $W_5=12$, $W_6=0$ and $W_7=-4$ per the example described by Ng. The real-response filter, in addition to the single-clock-delay elements 100–114, includes a digital subtractor 121 for subtracting the response of the delay element 114 from the response of the delay element 100, a digital multiplier 122 for weighting the differential response of the subtractor 121 by a factor of four, a digital subtractor 125 for subtracting the response of the delay element 103 from the response of the delay element 109, a digital multiplier 126 for weighting the differential response of the subtractor 125 by a factor of twelve, a digital subtractor 127 for subtracting the response of the delay element 105 from the response of the delay element 107, a digital multiplier 128 for weighting the differential response of the subtractor 127 by a factor of seventy-two, a digital adder 129 for summing the products from the digital multipliers 126 and 128, a digital adder 130 for summing the product from the digital multiplier 122 with the sum output signal from the adder 129, and a 2:1 decimator 131 for generating the real filter response Re in decimated response to the sum output signal from the adder 130.

The subtractor 121 subtracts the response of the delay element 114 from the response of the delay element 100, rather than subtracting the response of the delay element 113 from the output signal of the ADC 22, to introduce single-clock-duration delay to compensate for the latency of the adder 129. Since $W_1=0$ and $W_6=0$, there is no digital subtractor 123 for subtracting the response of the delay element 111 from the response of the delay element 101 or digital multiplier 124 for weighting the differential response of the subtractor 123. Consequently, there is no digital adder for summing product from the multiplier 124 with the product from the multiplier 122. This gives rise to the need to compensate for the latency of the adder 129.

In order to generate the imaginary response $H_1(z)$, the imaginary-response filter is presumed to apply tap weights $W_8=8$, $W_9=14$, $W_{10}=22$, $W_{11}=96$, $W_{12}=22$, $W_{13}=14$, $W_{14}=8$ corrected from the example described by Ng. The imaginary-response filter, in addition to the single-clock-delay elements 100–112, includes a digital adder 141 for adding the response of the delay element 112 with the response of the delay element 100, a digital multiplier 142 for weighting the sum response of the adder 141 by a factor of eight, a digital adder 143 for adding the response of the delay element 110 with the response of the delay element 102, a digital multiplier 144 for weighting the sum response of the adder 143 by a factor of fourteen, a digital adder 145 for adding the response of the delay element 108 with the response of the delay element 104, a digital multiplier 146 for weighting the sum response of the adder 145 by a factor of twenty-two, a digital multiplier 147 for weighting the response of the delay element 107 by a factor of ninety-six, a digital adder 148 for summing the products from the digital multipliers 142 and 144, a digital adder 149 for summing the products from the digital multipliers 146 and 147, a digital adder 150 for summing the sum output signals from the adders 148 and 149, and a 2:1 decimator 151 for generating the imaginary filter response Im in decimated response to the sum output signal from the adder 150.

The digital multiplier 147 weights the response of the delay element 107 by a factor of ninety-six, rather than the response of the delay element 106, in order to introduce single-clock-duration delay to compensate for the single-clock-duration latency of each of the adders 141 143 and 145.

Less preferred embodiments of the invention are contemplated in which the trellis-decoded output signals of the two-dimensional symbol decoding circuitry 37 and of the one-dimensional symbol decoding circuitry 38 are supplied to respective data de-interleavers, with data source selection being deferred until data de-interleaving is completed. Other less preferred embodiments of the invention are contemplated in which embodiments the trellis-decoded output signal of the two-dimensional symbol decoding circuitry 37 is de-interleaved by a respective data de-interleaver and then decoded by a respective Reed-Solomon decoder to generate a first stream of error-corrected data, in which embodiments the trellis-decoded output signal of the one-dimensional symbol decoding circuitry 38 is de-interleaved by a respective data de-interleaver and then decoded by a respective Reed-Solomon decoder to generate a second stream of error-corrected data, and in which embodiments data source selection is made between the first and second streams of error-corrected data. In modifications of these other less preferred embodiments of the invention the first and second streams of error-corrected data are supplied to separate data de-randomizers before data source selection is made. In other variants separate Reed-Solomon decoders are used for the QAM and VSB signals, but one data de-interleaver is used for both the QAM and VSB signals, or one data de-randomizer is used for both the first and second streams of error-corrected data.

The 2:1 decimator 35 of FIG. 1 is replaced by a 4:1 decimator in embodiments of the invention in which the ADC 22 samples at a 43.05 * $10^6$ samples per second sample rate during digitization, rather than a 21.52 * $10^6$ samples per second sample rate. Such change requires appropriate modifications to the sample clock generator 23, of course. A sample rate higher than 21.52 * $10^6$ samples per second is used when the synchrodyne circuitry 25 or 30 must synchrodyne to baseband a DTV signal having a carrier frequency higher than 5.38 MHz. Such a situation obtains when the synchrodyne circuitry 30 must synchrodyne to baseband a VSB signal having its vestigial sideband at frequencies greater than those in its full sideband. Decimators which decimate a baseband signal by a factor N more than two are better designed not to merely omit samples but rather to pre-filter the baseband signal and then to omit samples of the pre-filter response.

The preferred embodiments of the invention described supra use QAM synchrodyning circuitry and VSB synchrodyning circuitry of digital type. However, in other embodiments of the invention synchrodyning of the VSB signal to baseband is done using an analog synchronous detector, which is followed by an analog-to-digital converter for digitizing response from the analog synchronous detector to generate a real sample stream of interleaved VSB symbol code. In these other embodiments of the invention synchrodyning of the QAM signal to baseband is done using in-phase and quadrature-phase analog synchronous detectors, which are followed by analog-to-digital conversion circuitry for digitizing response from the in-phase analog synchronous detector to generate a real sample stream of interleaved QAM symbol code and for digitizing response from the quadrature-phase analog synchronous detector to generate an imaginary sample stream of interleaved QAM symbol code. Digitizing final IF signals rather than baseband signals reduces the number of analog-to-digital conversion procedures that must be done and avoids any problem with tracking the conversion characteristics of two analog-to-digital converters used in the QAM synchrodyning circuitry.

The detection circuitry for detecting whether said final IF signal is a QAM signal or a VSB signal, in order to generate a control signal, can employ techniques other than the detection of the presence or absence of appreciable average energy at VSB pilot carrier frequency. The detection circuitry can use an imaginary sample presence detector for detecting the presence or absence of substantial energy in the imaginary signal output of the VSB synchrodyning circuitry, as disclosed in U.S. Pat. No. 5,506,636, for example. The detection circuitry can use the imaginary sample presence detector alone, or together with a pilot presence detector.

Television engineers are currently considering using the digital transmission system for HDTV for transmitting other types of television signals—for example, four television signals with resolution similar to present-day NTSC signals that are simultaneously transmitted. The invention is suitable for use in receivers for these alternative transmission schemes, and the claims which follow should be construed broadly enough to include such receivers within their scope.

In the claims which follow, the word "said" is used whenever reference is made to an antecedent, and the word "the" is used for grammatical purposes other than to refer back to an antecedent.

What is claimed is:

1. A radio receiver for receiving a selected one of digital television signals each including symbol codes descriptive of digital signals, irrespective of whether said selected digital television signal is a quadrature-amplitude-modulation (QAM) signal or is a vestigial-sideband (VSB) signal including a pilot carrier having an amplitude related to signal levels in said symbol codes thereof, said radio receiver comprising:
   a pilot carrier presence detector detecting the presence or absence of a pilot carrier accompanying said selected digital television signal for generating indications of whether said selected digital television signal is of VSB or QAM type;
   means responding to indications generated by said pilot carrier presence detector that said selected digital television signal is of VSB type for automatically switching the radio receiver for operation in a VSB signal reception mode; and
   means responding to indications generated by said pilot carrier presence detector that said selected digital television signal is of QAM type for automatically switching the radio receiver for operation in a QAM signal reception mode.

2. A radio receiver for receiving a selected digital television signal, irrespective of whether it is a quadrature-amplitude-modulation (QAM) or a vestigial-sideband (VSB) signal, comprising:
   a tuner for selecting said selected digital television signal, irrespective of whether it is a quadrature-amplitude-modulation (QAM) or a vestigial sideband (VSB) signal, and converting it to a final intermediate-frequency (IF) signal;
   QAM synchrodyning circuitry for generating real and imaginary sample streams of QAM symbol code, by synchrodyning said final IF signal to baseband providing it is a QAM signal and otherwise processing said final IF signal as if it were a QAM signal to be synchrodyned to baseband; and
   VSB synchrodyning circuitry for generating a real sample stream of VSB symbol code, by synchrodyning said final IF signal to baseband providing it is a VSB signal and otherwise processing said final IF signal as if it were a VSB signal to be synchrodyned to baseband.

3. A radio receiver as set forth in claim 2, further comprising:
   detection circuitry for detecting whether said final IF signal is a QAM signal or a VSB signal to generate a control signal, said control signal being in a first condition when said final IF signal is a QAM signal and being in a second condition when said final IF signal is a VSB signal;
   circuitry responding to said control signal being in a first condition for automatically switching the radio receiver to operate in a QAM signal reception mode; and
   circuitry responding to said control signal being in a second condition for automatically switching the radio receiver to operate in a VSB signal reception mode.

4. A radio receiver as set forth in claim 3 wherein said detection circuitry for detecting whether said final IF signal is a QAM signal or a VSB signal comprises:
   a pilot carrier presence detector for generating said control signal, said pilot carrier presence detector generating said first condition of said control signal when detecting the presence of a pilot carrier of substantial energy and otherwise generating said second condition of said control signal.

5. A radio receiver as set forth in claim 2, further comprising:
   detection circuitry for detecting whether said final IF signal is a QAM signal or a VSB signal to generate a control signal, said control signal being in a first condition when said final IF signal is a QAM signal and being in a second condition when said final IF signal is a VSB signal;
   an amplitude equalizer having real-sample and imaginary-sample input terminals, real-sample and imaginary-sample output terminals, a programmable digital filter for processing digital signal received at the input terminals of said amplitude equalizer to supply amplitude-equalized response at the real-sample and imaginary-sample output terminals of said amplitude equalizer, and
   computing elements for programming said digital filter in accordance with said control signal and with selected portions of the digital signal received at the input terminals of said amplitude equalizer; and
   a synchrodyne result selector, responsive to the first condition of said control signal for selecting said real sample stream of QAM symbol code for application to the real-sample input terminal of said amplitude equalizer, further responsive to the first condition of said control signal for selecting said imaginary sample stream of QAM symbol code for application to the imaginary-sample input terminal of said amplitude equalizer, responsive to the second condition of said control signal for selecting said real sample stream of VSB symbol code for application to the real-sample input terminal of said amplitude equalizer, and further responsive to the second condition of said control signal for selecting arithmetic zero to the imaginary-sample input terminal of said amplitude equalizer.

6. A radio receiver as set forth in claim 5, wherein said detection circuitry for detecting whether said final IF signal is a QAM signal or a VSB signal comprises:

a pilot carrier presence detector detecting the presence or absence of a pilot carrier accompanying said selected digital television signal for generating said control signal.

7. A radio receiver as set forth in claim 5, including 2:1 decimation circuitry, for decimating 2:1 said samples applied to the real-sample input terminal of said amplitude equalizer, and for decimating 2:1 said samples applied to the imaginary-sample input terminal of said amplitude equalizer.

8. A radio receiver as set forth in claim 5, further comprising:

a two-dimensional trellis decoder for performing symbol decoding that recovers a digital data stream from the amplitude-equalized response of said amplitude equalizer when said final IF signal is a QAM signal;

first data synchronization recovery circuitry for recovering first data synchronizing information included in the digital data stream from the two-dimensional trellis decoder;

a one-dimensional trellis decoder for performing symbol decoding that recovers a digital data stream from the amplitude-equalized response of said amplitude equalizer when said final IF signal is a VSB signal;

second data synchronization recovery circuitry for recovering second data synchronizing information included in the digital data stream from the one-dimensional trellis decoder;

a data source selector, responsive to the first condition of said control signal for selecting as its output signal the digital data stream from said two-dimensional trellis decoder, and responsive to the second condition of said control signal for selecting as its output signal the digital data stream from said one-dimensional trellis decoder; and a data sync selector, responsive to the first condition of said control signal for selecting as its output signal said first data synchronizing information, and responsive to the second condition of said control signal for selecting as its output signal said second data synchronizing information.

9. A radio receiver as set forth in claim 8, further comprising:

a data de-interleaver receiving the output signals of said data source selector and said data sync selector as input signals thereto, said data de-interleaver de-interleaving the output signal of said data source selector in one of two patterns, as selected by said control signal, for supplying de-interleaved data as its output signal.

10. A radio receiver as set forth in claim 9, further comprising:

a Reed-Solomon decoder receiving the output signals of said data de-interleaver and said data sync selector as input signals thereto, said Reed-Solomon decoder decoding the output signal of said data de-interleaver in accordance with one of two Reed-Solomon decoding algorithms, as selected by said control signal, for supplying error-corrected data as its output signal.

11. A radio receiver as set forth in claim 10, further comprising:

a data de-randomizer, connected for receiving said error-corrected data from said Reed-Solomon decoder and said data sync selector as input signals thereto, and connected for supplying de-randomized error-corrected data as an output signal therefrom.

12. A radio receiver as set forth in claim 11, for receiving a selected digital television signal of a type causing said de-randomized error-corrected data to be arranged in packets, said radio receiver further comprising:

a digital sound decoder;

an MPEG video decoder; and a packet sorter receiving as its input signal the output signal of said data de-randomizer and sorting said packets of said de-randomized error-corrected data therein, for applying certain ones of said packets to said digital sound decoder as input signal thereto, and for applying certain ones of said packets to said MPEG video decoder as input signal thereto.

13. A radio receiver for receiving a selected digital television signal, irrespective of whether it is a quadrature-amplitude-modulation (QAM) or a vestigial-sideband (VSB) signal, comprising:

a tuner for selecting said selected digital television signal, irrespective of whether it is a quadrature-amplitude-modulation (QAM) or a vestigial sideband (VSB) signal, and converting it to a final intermediate-frequency (IF) signal;

an analog-to-digital converter for digitizing said final IF signal to generate a digitized final IF signal;

QAM synchrodyning circuitry for generating real and imaginary sample streams of QAM symbol code, by synchrodyning said digitized final IF signal to baseband providing it is a QAM signal and otherwise processing said digitized final IF signal as if it were a QAM signal to be synchrodyned to baseband; and VSB synchrodyning circuitry for generating a real sample stream of VSB symbol code, by synchrodyning said digitized final IF signal to baseband providing it is a VSB signal and otherwise processing said digitized final IF signal as if it were a VSB signal to be synchrodyned to baseband.

14. A radio receiver as set forth in claim 13, wherein said final IF signal resides in a frequency band the lowest frequency of which is not appreciably more than 2.69 MHz, which frequency band is substantially 6 MHz wide.

15. A radio receiver as set forth in claim 13, further comprising:

detection circuitry for detecting whether said final IF signal is a QAM signal or a VSB signal to generate a control signal, said control signal being in a first condition when said final IF signal is a QAM signal and being in a second condition when said final IF signal is a VSB signal;

means responding to said control signal being in a first condition for automatically switching the radio receiver to operate in a QAM signal reception mode; and means responding to said control signal being in a second condition for automatically switching the radio receiver to operate in a VSB signal reception mode.

16. A radio receiver as set forth in claim 15 wherein said detection circuitry for detecting whether said final IF signal is a QAM signal or a VSB signal comprises:

a pilot carrier presence detector for generating said control signal, said pilot carrier presence detector generating said first condition of said control signal when detecting the presence of a pilot carrier of substantial energy and otherwise generating said second condition of said control signal.

17. A radio receiver as set forth in claim 16, wherein said tuner includes first and second intermediate-frequency amplifiers, said radio receiver further comprising:

a digital-to-analog converter for converting to an analog output signal therefrom, a digital input signal supplied thereto;

means for controlling the gains of said first and second intermediate-frequency amplifiers in accordance with said analog output signal from said digital-to-analog converter;

means for squaring each of the samples in one of real and imaginary sample streams of interleaved QAM symbol code;

a first lowpass digital filter for obtaining the mean average of the resulting squared samples;

means for determining the departure from a first prescribed value, of said mean average of said resulting squared samples, thereby to generate a first digital AGC signal;

a second lowpass digital filter for obtaining the mean average of the samples in said real sample stream of interleaved VSB symbol code, said second lowpass digital filter being included in said pilot carrier presence detector;

means for determining the departure from a second prescribed value, of said mean average of said samples in said real sample stream of interleaved VSB symbol code, thereby to generate a second digital AGC signal;

a multiplexer, said multiplexer responding to indications generated by said pilot carrier presence detector that said selected digital television signal is of QAM type for selecting said first digital AGC signal as the digital input signal supplied to said digital-to-analog converter, said multiplexer responding to indications generated by said pilot carrier presence detector that said selected digital television signal is of VSB type for selecting said second digital AGC signal as the digital input signal supplied to said digital-to-analog converter; and means, included in said pilot carrier presence detector, for determining the departure from a third prescribed value, of said mean average of said samples in said real sample stream of interleaved VSB symbol code, the polarity of said departure from a third prescribed value indicating whether said pilot carrier presence detector indicates the presence or absence of pilot carrier accompanying said selected television signal.

18. A radio receiver as set forth in claim 13, wherein said tuner includes first and second intermediate-frequency amplifiers, said radio receiver further comprising:

a digital-to-analog converter for converting to an analog output signal therefrom, a digital input signal supplied thereto;

means for controlling the gains of said first and second intermediate-frequency amplifiers in accordance with said analog output signal from said digital-to-analog converter;

means for squaring each of the samples in one of real and imaginary sample streams of QAM symbol code;

a first lowpass digital filter for obtaining the mean average of the resulting squared samples;

means for determining the departure from a first prescribed value, of said mean average of said resulting squared samples, thereby to generate a first digital AGC signal;

a second lowpass digital filter for obtaining the mean average of the samples in said real sample stream of VSB symbol code;

means for determining the departure from a second prescribed value, of said mean average of said samples in said real sample stream of VSB symbol code, thereby to generate a second digital AGC signal; and a multiplexer, said multiplexer responding to said control signal being in a first condition for selecting said first digital AGC signal as the digital input signal supplied to said digital-to-analog converter, said multiplexer responding to said control signal being in a second condition for selecting said second digital AGC signal as the digital input signal supplied to said digital-to-analog converter.

19. A radio receiver as set forth in claim 13, further comprising:

detection circuitry for detecting whether said final IF signal is a QAM signal or a VSB signal to generate a control signal, said control signal being in a first condition when said final IF signal is a QAM signal and being in a second condition when said final IF signal is a VSB signal;

an amplitude equalizer having real-sample and imaginary-sample input terminals, real-sample and imaginary-sample output terminals, a programmable digital filter for processing digital signal received at the input terminals of said amplitude equalizer to supply amplitude-equalized response at the real-sample and imaginary-sample output terminals of said amplitude equalizer, and computing elements for programming said digital filter in accordance with said control signal and with selected portions of the digital signal received at the input terminals of said amplitude equalizer; and a synchrodyne result selector, responsive to the first condition of said control signal for selecting said real sample stream of QAM symbol code for application to the real-sample input terminal of said amplitude equalizer, further responsive to the first condition of said control signal for selecting said imaginary sample stream of QAM symbol code for application to the imaginary-sample input terminal of said amplitude equalizer, responsive to the second condition of said control signal for selecting said real sample stream of VSB symbol code for application to the real-sample input terminal of said amplitude equalizer, and further responsive to the second condition of said control signal for selecting arithmetic zero to the imaginary-sample input terminal of said amplitude equalizer.

20. A radio receiver as set forth in claim 19, wherein said detection circuitry for detecting whether said final IF signal is a QAM signal or a VSB signal comprises:

a pilot carrier presence detector detecting the presence or absence of a pilot carrier accompanying said selected digital television signal for generating said control signal.

21. A radio receiver as set forth in claim 19, including 2:1 decimation circuitry, for decimating 2:1 said samples applied to the real-sample input terminal of said amplitude equalizer, and for decimating 2:1 said samples applied to the imaginary-sample input terminal of said amplitude equalizer.

22. A radio receiver as set forth in claim 19, further comprising:
   a two-dimensional trellis decoder for performing symbol decoding that recovers a digital data stream from the amplitude-equalized response of said amplitude equalizer when said final IF signal is a QAM signal;
   first data synchronization recovery circuitry for recovering first data synchronizing information included in the digital data stream from the two-dimensional trellis decoder;
   a one-dimensional trellis decoder for performing symbol decoding that recovers a digital data stream from the amplitude-equalized response of said amplitude equalizer when said final IF signal is a VSB signal;
   second data synchronization recovery circuitry for recovering second data synchronizing information included in the digital data stream from the one-dimensional trellis decoder;
   a data source selector, responsive to the first condition of said control signal for selecting as its output signal the digital data stream from said two-dimensional trellis decoder, and responsive to the second condition of said control signal for selecting as its output signal the digital data stream from said one-dimensional trellis decoder; and
   a data sync selector, responsive to the first condition of said control signal for selecting as its output signal said first data synchronizing information, and responsive to the second condition of said control signal for selecting as its output signal said second data synchronizing information.

23. A radio receiver as set forth in claim 22, further comprising:
   a data de-interleaver receiving the output signals of said data source selector and said data sync selector as input signals thereto, said data de-interleaver de-interleaving the output signal of said data source selector in one of two patterns, as selected by said control signal, for supplying de-interleaved data as its output signal.

24. A radio receiver as set forth in claim 23, further comprising:
   a Reed-Solomon decoder receiving the output signals of said data de-interleaver and said data sync selector as input signals thereto, said Reed-Solomon decoder decoding the output signal of said data de-interleaver in accordance with one of two Reed-Solomon decoding algorithms, as selected by said control signal, for supplying error-corrected data as its output signal.

25. A radio receiver as set forth in claim 24, further comprising:
   a data de-randomizer, connected for receiving said error-corrected data from said Reed-Solomon decoder and said data sync selector as input signals thereto, and connected for supplying de-randomized error-corrected data as an output signal therefrom.

26. A radio receiver as set forth in claim 25, for receiving a selected digital television signal of a type causing said de-randomized error-corrected data to be arranged in packets, said radio receiver further comprising:
   a digital sound decoder;
   an MPEG video decoder; and
   a packet sorter receiving as its input signal the output signal of said data de-randomizer and sorting said packets of said de-randomized error-corrected data therein, for applying certain ones of said packets to said digital sound decoder as input signal thereto, and for applying certain ones of said packets to said MPEG video decoder as input signal thereto.

27. A radio receiver for receiving a selected one of digital television signals each including symbol codes descriptive of digital signals, irrespective of whether said selected digital television signal is a quadrature-amplitude-modulation (QAM) signal or is a vestigial-sideband (VSB) signal including a pilot carrier having an amplitude related to signal levels in said symbol codes thereof, said radio receiver comprising:
   a tuner, including
   means for selecting one of channels at different locations in a frequency band used for transmitting digital television signals, including
   a succession of mixers for performing a plural conversion of signal received in the selected channel to a final intermediate-frequency (IF) signal, including
   a respective frequency-selective amplifier between each earlier one of said mixers in said succession and each next one of said mixers in said succession, and including
   respective local oscillators for supplying oscillations of different frequencies to each of said mixers, each of said local oscillators supplying respective oscillations of substantially the same frequency irrespective of whether the selected digital television signal is a QAM signal or is a VSB signal;
   a sample clock generator for generating a sample clock signal comprising recurrent pulses supplied at a rate controlled to be a multiple of the symbol frequency of said selected digital television signal;
   an analog-to-digital converter responsive to said sample clock signal for recurrently sampling a lowpass response to the signal from the final mixer in said succession of mixers included in said tuner, and for digitizing the resulting samples to generate a digitized final intermediate frequency signal;
   means for modularly counting said recurrent pulses to generate a first address count;
   means combining a first symbol phase correction with said first address count for generating first read-only memory addressing;
   first read-only memory addressed by said first read-only memory addressing for generating digital descriptions of in-phase and quadrature-phase QAM signal carriers;
   means for modularly counting said recurrent pulses to generate a second address count;
   means combining a second symbol phase correction with said second address count for generating second read-only memory addressing;
   second read-only memory addressed by said second read-only memory addressing for generating digital descriptions of in-phase and quadrature-phase VSB signal carriers;
   first and second synchrodyning means each using said digital descriptions of in-phase and quadrature-phase QAM signal carriers for generating first and second synchrodyning results, respectively, in which said first and second synchrodyning results real and in-phase components of said digitized final intermediate frequency signal are respectively synchrodyned each to baseband whenever said selected digital television signal is a QAM signal;

a first symbol decoder for decoding said symbol codes, as encoded in said first and second synchrodyning results whenever said selected digital television signal is a QAM signal, for generating a first data stream;

a first phase correction generator for generating said first symbol phase correction responsive to said first and second synchrodyning results;

third synchrodyning means using said digital descriptions of in-phase and quadrature-phase VSB signal carriers for generating a third synchrodyning result, in which said third synchrodyning result a real component of said digitized final intermediate frequency signal is synchrodyned to baseband whenever said selected digital television signal is a VSB signal;

a second symbol decoder for decoding said symbol codes, as encoded in said third synchrodyning result whenever said selected digital television signal is a VSB signal, for generating a second data stream;

a second phase correction generator for generating said second symbol phase correction responsive to said third synchrodyning result;

detection circuitry for detecting whether said final IF signal is a QAM signal or a VSB signal to generate a control signal, said control signal being in a first condition when said final IF signal is a QAM signal and being in a second condition when said final IF signal is a VSB signal;

means responding to said control signal being in a first condition for automatically switching the radio receiver to operate in a QAM signal reception mode; and means responding to said control signal being in a second condition for automatically switching the radio receiver to operate in a VSB signal reception mode.

28. A radio receiver as set forth in claim 27, wherein said detection circuitry for detecting whether said final IF signal is a QAM signal or a VSB signal comprises:

a pilot carrier presence detector detecting the presence or absence of a pilot carrier accompanying said selected digital television signal for generating said control signal.

29. A radio receiver as set forth in claim 27, further comprising:

a generator of first automatic frequency control signal, which first frequency control signal is generated in response to said first and second synchrodyning results;

means for selectively applying said first automatic frequency control signal to an automatic-frequency-controlled one of said local oscillators in said tuner whenever said control signal is in its said first condition, thereby regulating the frequency of the signal from said final mixer so said first and second synchrodyning results are at baseband, which means for selectively applying said first automatic frequency control signal is included in said means responding to said control signal being in a first condition for automatically switching the radio receiver to operate in a QAM signal reception mode;

fourth synchrodyning means using said digital descriptions of in-phase and quadrature-phase VSB signal carriers for generating a fourth synchrodyning result, in which said fourth synchrodyning result an imaginary component of said digitized final intermediate frequency signal is synchrodyned to baseband whenever said selected digital television signal is a VSB signal;

a generator of second automatic frequency control signal, which second frequency control signal is generated in response to said fourth synchrodyning result; and means for selectively applying said second automatic frequency control signal to said automatic-frequency-controlled one of said local oscillators in said tuner whenever said control signal is in its said second condition, thereby regulating the frequency of the signal from said final mixer so said third and fourth synchrodyning results are at baseband, which means for selectively applying said second automatic frequency control signal is included in said means responding to said control signal being in a second condition for automatically switching the radio receiver to operate in a VSB signal reception mode.

* * * * *